(12) United States Patent
Kajiyama

(10) Patent No.: US 7,141,842 B2
(45) Date of Patent: Nov. 28, 2006

(54) MAGNETIC MEMORY DEVICE AND METHOD OF MANUFACTURING THE SAME

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 10/736,831

(22) Filed: Dec. 17, 2003

(65) Prior Publication Data
US 2005/0070033 A1    Mar. 31, 2005

(30) Foreign Application Priority Data
Sep. 29, 2003  (JP)  ............... 2003-337511

(51) Int. Cl.
  *H01L 31/062*  (2006.01)
(52) U.S. Cl. .................. 257/295; 438/3; 257/E29.164
(58) Field of Classification Search ................ 257/295, 257/297, E29.164; 438/3
See application file for complete search history.

(56) References Cited

U.S. PATENT DOCUMENTS 6,548,849 B1 *  4/2003  Pan et al. .................... 257/296
6,590,244 B1 *  7/2003  Asao et al. .................. 257/295

FOREIGN PATENT DOCUMENTS

| JP | 2001-519092 | 10/2001 |
| JP | 2002-110938 | 4/2002 |
| JP | 2002-277500 | 9/2002 |
| JP | 2002-289807 | 10/2002 |
| JP | 2002-299575 | 10/2002 |
| JP | 2002-359356 | 12/2002 |
| JP | 2003-243631 | 8/2003 |

OTHER PUBLICATIONS

Roy Scheuerlein, et al., ISSCC 2000 Technical Digest, 2000 IEEE International Solid-State Circuits Conference, vol. 43, pp. 128-129, "A 10NS Read and Write Non-Volatile Memory Array Using a Magnetic Tunnel Junction and FET Switch in Each Cell", Feb. 7, 8, and 9, 2000.

* cited by examiner

*Primary Examiner*—Richard A. Booth
(74) *Attorney, Agent, or Firm*—Oblon, Spivak, McClelland, Maier & Neustadt, P.C.

(57) ABSTRACT

A magnetic memory device includes a memory cell which has a first wiring line composed of a first wiring layer, a second wiring line composed of a second wiring layer and provided above or below the first wiring line so as to cross the first wiring line, and a magnetoresistive effect element device provided in a position where the first wiring line and the second wiring line cross each other. The device further includes a peripheral circuit which includes a third wiring line provided around the memory cell and composed of the first wiring layer, a fourth wiring line provided above or below the third wiring line and composed of the second wiring layer, and at least one magnetic layer forming the magnetoresistive effect element device and provided between the third wiring line and the fourth wiring line.

10 Claims, 25 Drawing Sheets

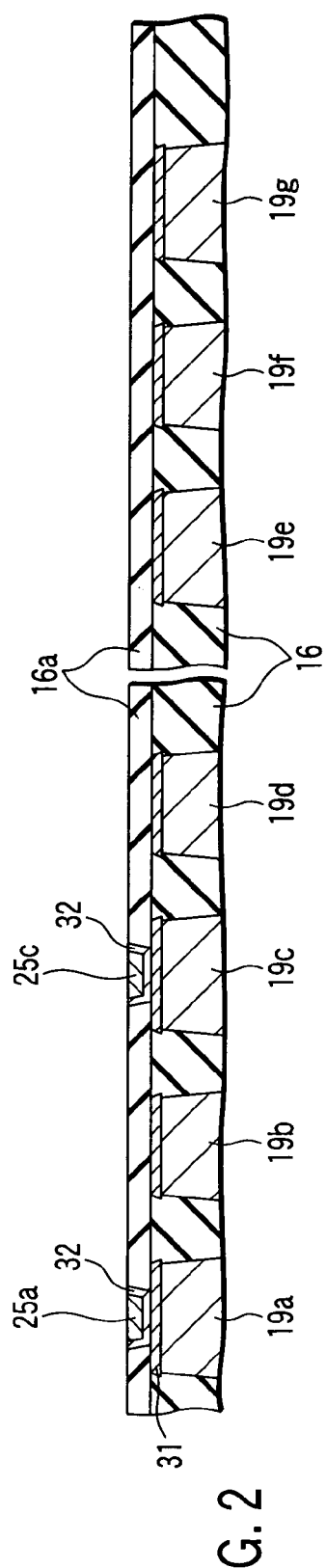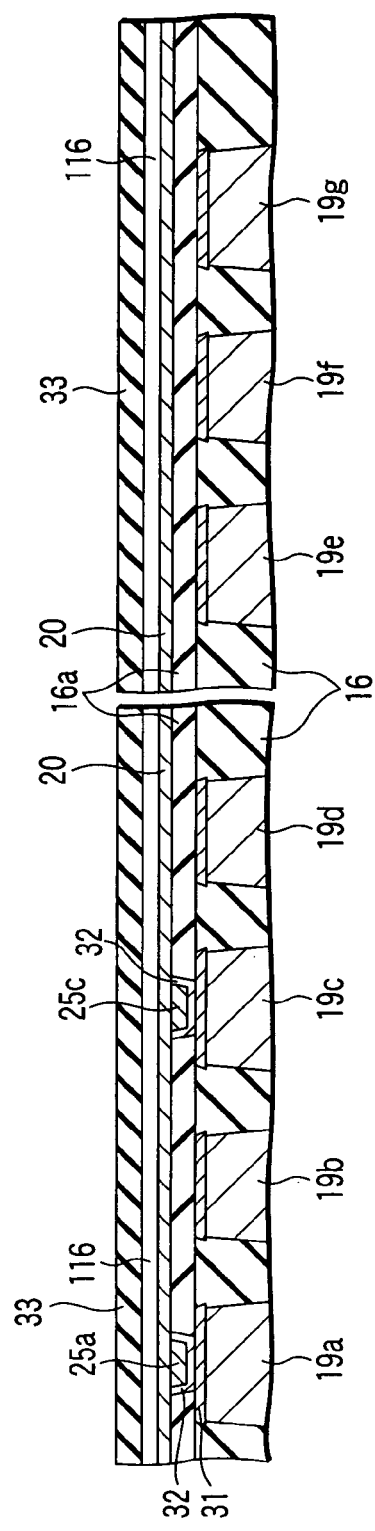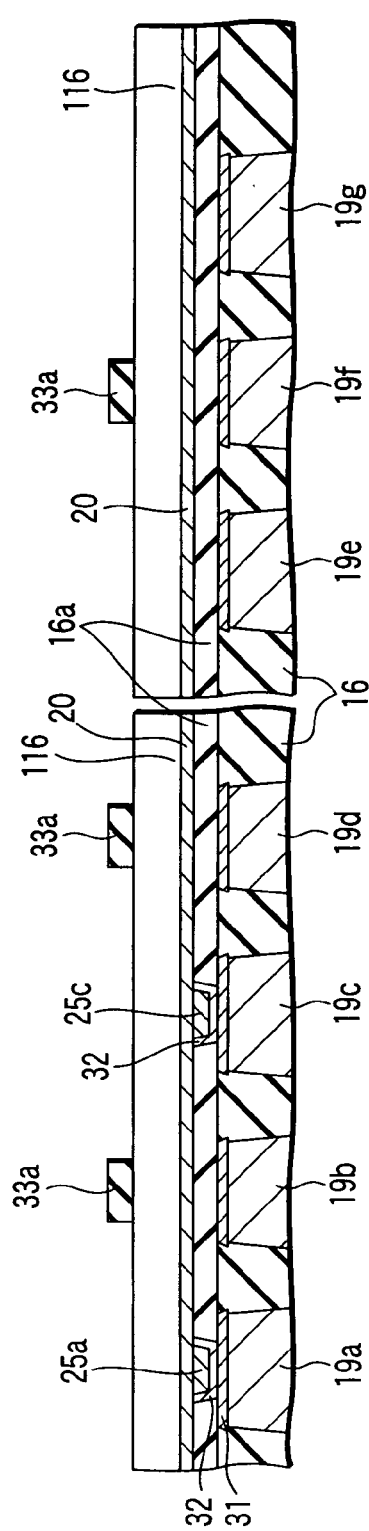

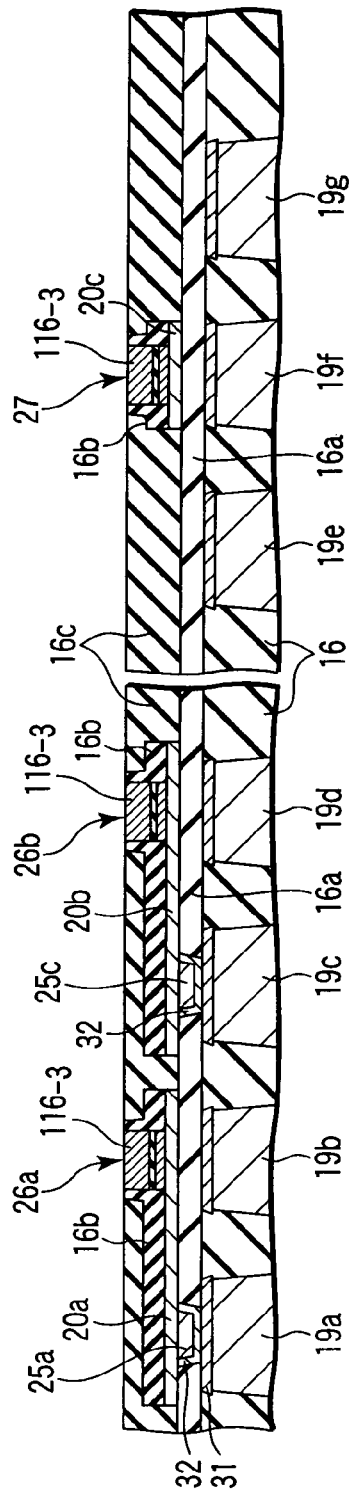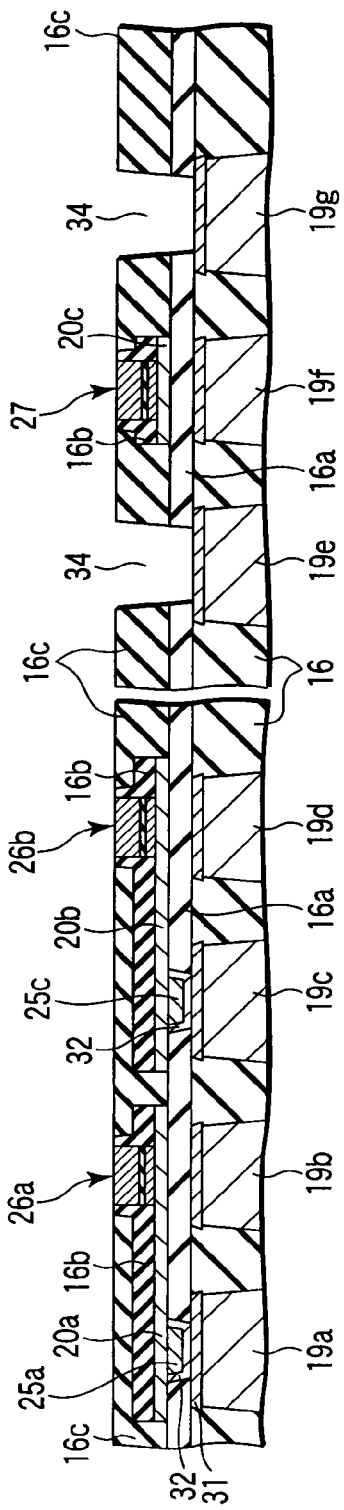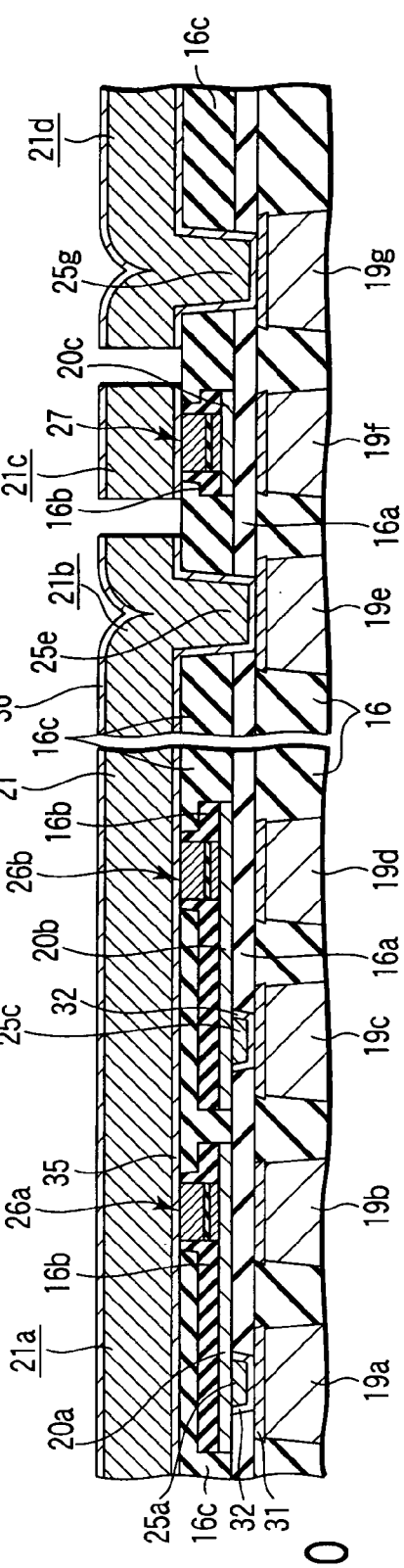

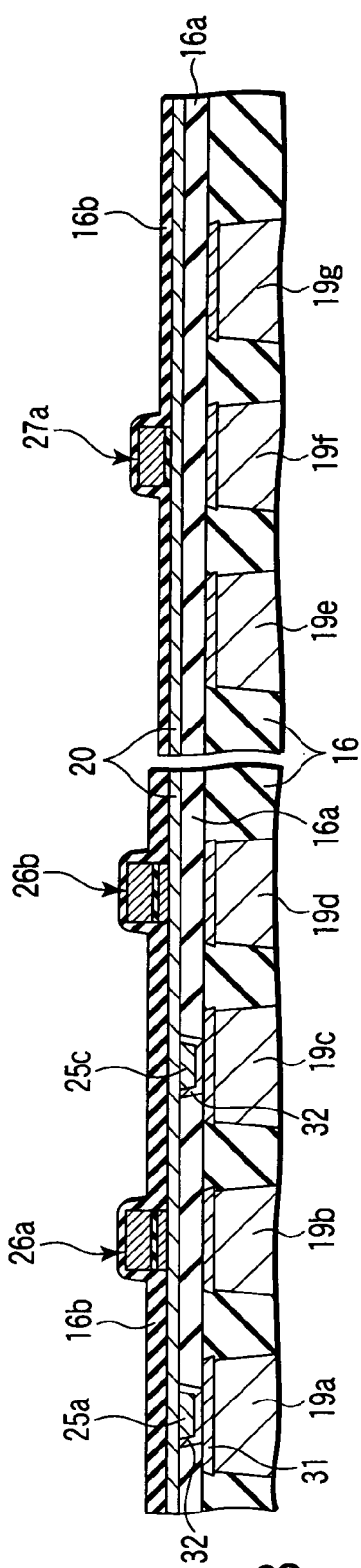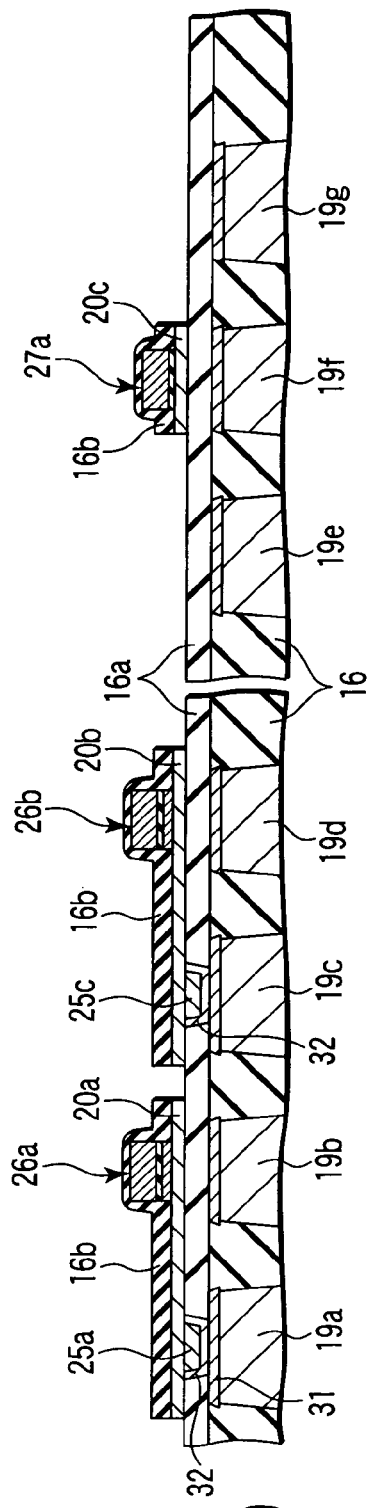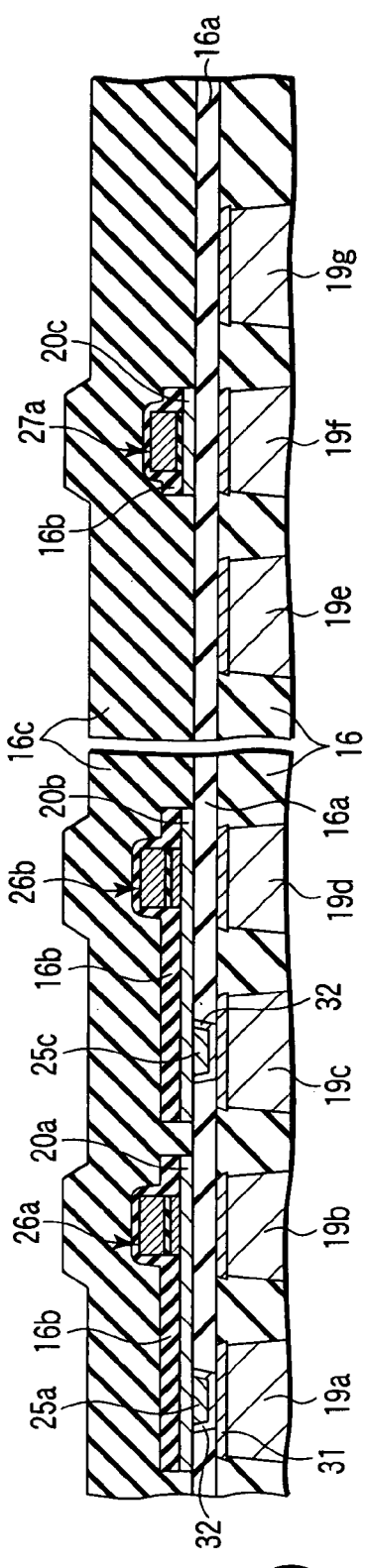

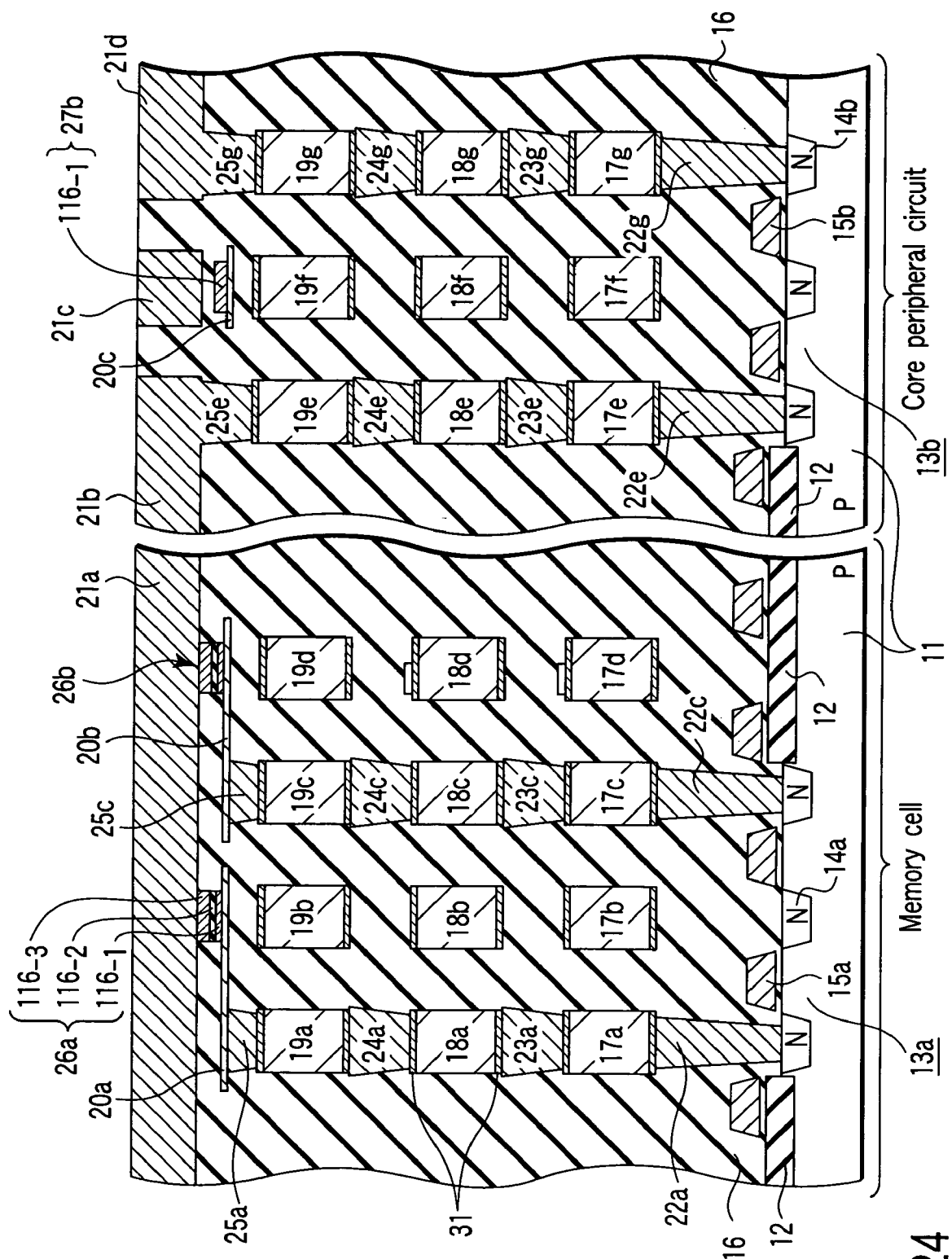
F I G. 24

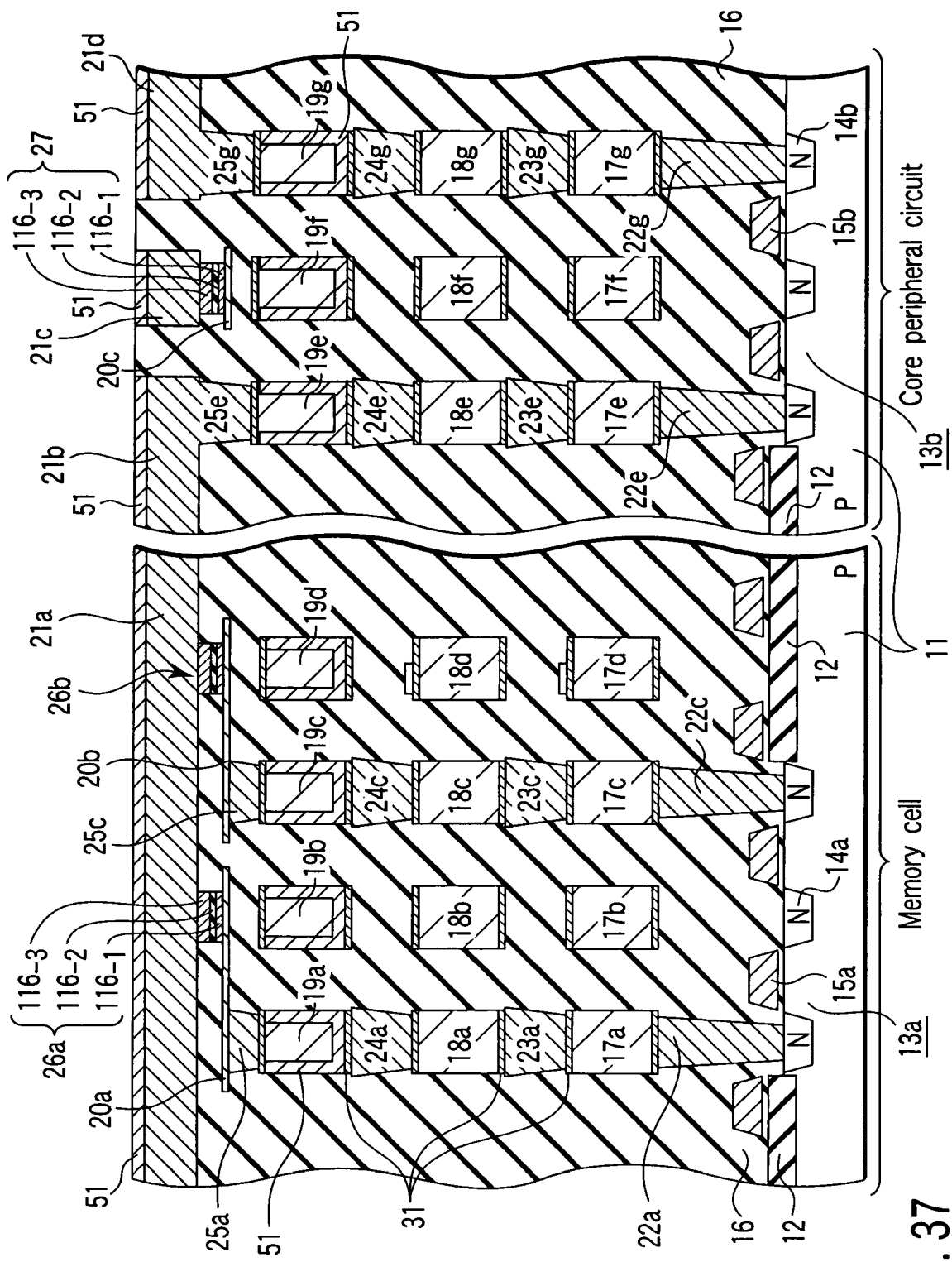
F I G. 37

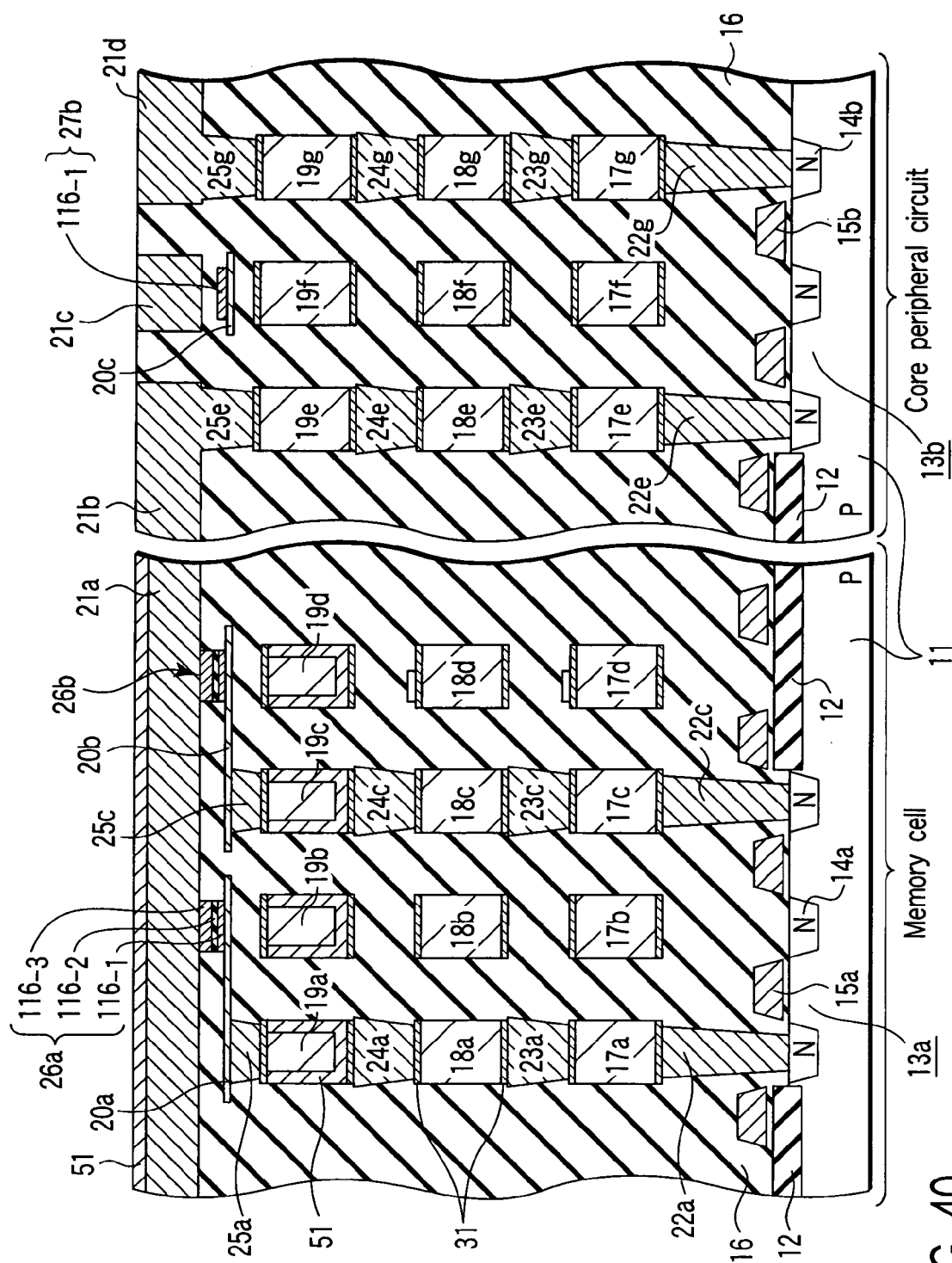
F I G. 40

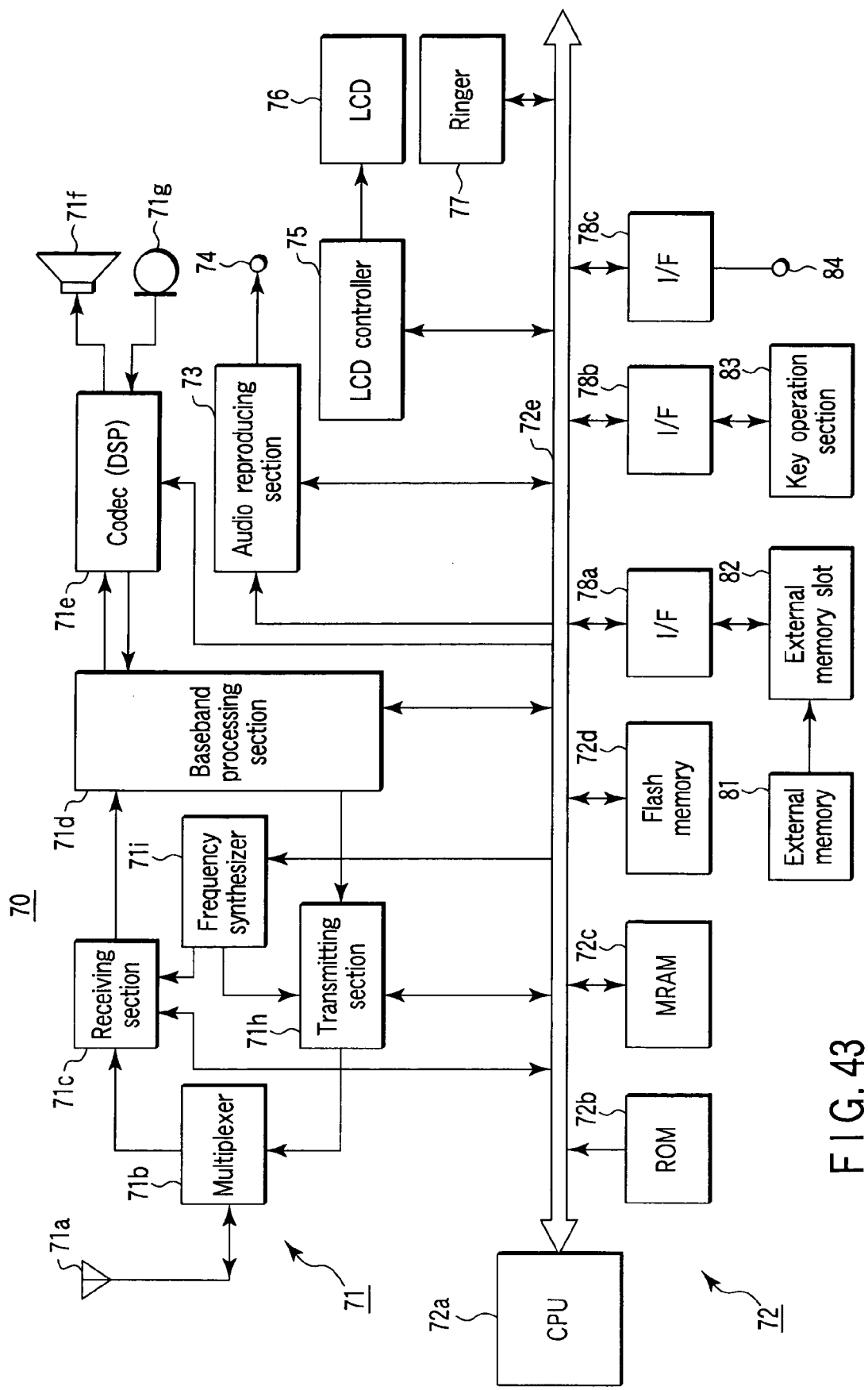
F I G. 43

To MRAM data rewriting control section

To MRAM data rewriting control section

MAGNETIC MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2003-337511, filed Sep. 29, 2003, the entire contents of which are incorporated herein by reference.

BACKGROUND OF THE INVENTION

1. Field of the Invention

This invention relates to a magnetic memory device and a method of manufacturing the magnetic memory device. More specifically, this invention relates to an MRAM (Magnetic Random Access Memory) using an MTJ (Magnetic Tunnel Junction) structure as memory element devices.

2. Description of the Related Art

A magnetic memory device using tunneling magneto resistive effect (hereinafter, abbreviated as TMR), so called MRAM, has been proposed (see, for example, "A 10 ns Read and Write Non-Volatile Memory Array Using a Magnetic Tunnel Junction and FET Switch in each Cell," ISSCC 2000 Technical Digest, p. 128).

FIG. 49 shows the basic configuration of a conventional MRAM. As shown in FIG. 49, a plurality of isolations 102 with an STI (Shallow Trench Isolation) structure are formed in the surface of a p-type semiconductor substrate (or, well region) 101. In each device region excluding the regions of isolations, a plurality of MOSFETs (Metal Oxide Semiconductor Field Effect Transistors) 103a, 103b are provided. Specifically, in the surface of the p-type semi-conductor substrate 101 corresponding to each device region demarcated by the plurality of isolations 102, for example, a plurality of n-type diffused layers 104a, 104b are selectively formed. On the surface of each p-type semiconductor substrate 101 between the plurality of diffused layers 104a, 104b, gate electrodes 105a, 105b are provided through a gate oxide film.

On the p-type semiconductor substrate 101, an insulator film 106 is provided. In the insulator film 106, for example, a plurality of wiring lines in a first level 107 to a fifth level 111 are formed. In this example, wiring lines 107a, 107b, 107c, 107d, 107e, 107f, 107g are provided in the first level 107. In the second level 108, wiring lines 108a, 108b, 108c, 108d, 108e, 108f, 108g are provided. In the third level 109, wiring lines 109a, 109b, 109c, 109d, 109e, 109f, 109g are provided. In the fourth level 110, wiring lines 110a, 110b are provided. In the fifth level 111, wiring lines 111a, 111b, 111c, 111d are provided.

Furthermore, in the insulator film 106, for example, there are provided first contact plugs 112a, 112c, 112e, 112g which connect the plurality of diffused levels 104a, 104b with each one of the wiring lines 107a, 107c, 107e, 107g in the first level 107. In addition, for example, there are provided second contact plugs 113a, 113c, 113e, 113g which connect the wiring lines 107a, 107c, 107e, 107g in the first level 107 with the wiring lines 108a, 108c, 108e, 108g in the second level 108, respectively. Moreover, for example, there are provided third contact plugs 114a, 114c, 114e, 114g which connect the wiring lines 108a, 108c, 108e, 108g in the second level 108 with the wiring lines 109a, 109c, 109e, 109g in the third level, respectively. Furthermore, for example, there are provided fourth contact plugs 115a, 115c which connect the wiring lines 109a, 109c in the third level 109 with the wiring lines 110a, 10b in the fourth level, respectively, and fourth contact plugs 115e, 115g which connect the wiring lines 109e, 109g in the third level 109 with the wiring lines 111b, 111d in the fifth level, respectively. In addition, for example, the wiring lines 110a, 110b in the fourth level 110 are connected with the wiring line 111a in the fifth level 111 via TMR element devices 116a, 116b.

The MRAM with such a configuration comprises a memory cell and a core peripheral circuit for controlling the memory cell. In the memory cell, the wiring line 111a in the fifth level 111 connected to the TMR element devices 116a, 116b functions as a bit line. The wiring lines 109b, 109d in the third level 109 not connected to any one of wiring lines 110a, 110b in the fourth level 110 function as write word lines. The write word lines 109b, 109d are arranged so as to be perpendicular to the bit line 111a. The TMR element devices 116a, 116b, which are placed at the inter-sections of the bit line 111a and the write word lines 109b, 109d, are used as memory element devices. The MOSFET 103a, which is connected electrically to the TMR element devices 116a, 116b, functions as a switching element device. The gate electrode 105a of the MOSFET 103a functions as a read word line.

FIG. 50 shows an equivalent circuit of the memory cell (MRAM cell) with the above configuration. As shown in FIG. 50, the bit line 111a, is arranged to cross the write word line 109b (or 109d) and read word line 105a perpendicularly. At the intersection of the bit line 111a and the write word line 109b (or 109d), the TMR element device 116a (or 116b) is placed. One end of the TMR element device 116a (or 116b) is connected to the bit line 111a and the other end of the TMR element device 116a is connected to the MOSFET 103a. The gate electrode 105a of the MOSFET 103a serves as the read word line.

FIG. 51 shows an example of the configuration of the TMR element devices 116a, 116b. Each of the TMR element devices 116a, 116b has a three-layered structure composed of two magnetic layers and a nonmagnetic layer sandwiched between the two layers. Specifically, each of the TMR element devices 116a, 116b is configured in such a manner that, for example, a fixed magnetic layer (magnetic layer) $116_{-1}$, a tunnel junction layer (nonmagnetic layer) $116_{-2}$, and a magnetic recording layer (magnetic layer) $116_{-3}$ are stacked one on top of another in that order.

The fixed magnetic layer $116_{-1}$, which is composed of an antiferromagnetic layer and a ferromagnetic layer, is called a pin layer since the direction of magnetization is fixed in one direction. In contrast, the magnetic recording layer $116_{-3}$, which is composed of a ferromagnetic layer, is called a memory layer for storing data since the direction of magnetization can be changed freely. The direction of magnetization in the magnetic recording layer $116_{-3}$ can be changed by a combined magnetic field (current magnetic field) produced by the current flowing through the bit line 111a and the current flowing thorough the write word lines 109b, 109d.

The operation of writing data into or reading data from an MRAM cell with such a configuration will be explained briefly. For example, to write data "1" or "0" into the TMR element device 116a, the write word line 109b and bit line 111a are selected first. Current (write current) is caused to flow through the selected write word line 109b and bit line 111a, thereby generating a current magnetic field. Then, only the magnetic field applied to the selected cell (TMR element device 116a) located at the intersection of the selected write word line 109b and bit line 111a exceeds the inversion threshold of magnetization in the TMR element device 116a. As a result, data is written into the TMR element device 116a.

At this time, for example, when the direction of magnetization in the fined magnetic layer $116_{-1}$ and that in the magnetic recording layer $116_{-3}$ are parallel to each other in the same direction, the tunnel resistance sensed by current flow through the tunnel junction layer $116_{-2}$ becomes the lowest. In this state, "1" can be stored. In contrast, when the direction of magnetization in the fixed magnetic layer $116_{-1}$ and that in the magnetic recording layer $116_{-3}$ are parallel to each other in opposite directions, the tunnel resistance sensed by current flow through the tunnel junction layer $116_{-2}$ becomes the highest. In this state, "0" can be stored. That is, in the MRAM, the difference in tunnel resistance is stored in the form of data "1" or "0."

On the other hand, to read data "1" or "0" written in the TMR element device 116a, the read word line 105a and bit line 111a are selected first. Then, current flows from the bit line 111a to the ground (Gnd) line through the TMR element device 116a and MOSFET 103a. The difference in the current flowing in the Gnd line is read as the difference in the tunnel resistance by the core peripheral circuit, thereby determining the data ("1" or "0") in the TMR element device 116a.

In the MRAM with the above configuration, to decrease the write current, it is desirable that the bit line 111a should be provided as close to the write word lines 109b, 109d as possible.

However, in the conventional MRAM having the aforementioned memory cell, the core peripheral circuit for controlling the memory cell is provided around the memory cell. The core peripheral circuit is generally formed by the same process with the memory cell from the viewpoint of cost performance. Therefore, arranging the bit line 111a and the write word lines 109b, 109d close to one another inevitably causes the wiring line 109f in the fourth level 109 and the wiring line 111c in the fifth level 111 in the core peripheral circuit to be provided close to each other.

However, when a plurality of wiring lines are arranged close to one another, inductance components are liable to induce. Particularly when two wiring lines arranged very close to each other are used in the core peripheral circuit, current flow in one wiring line can generate electromotive force on the other wiring line, which may cause a problem. Specifically, in the future, the bit line 111a and the write word lines 109b, 109d will possibly get closer and closer to one another. In that case, the wiring line 109f in the third level 109 and the wiring line 111c in the fifth level 111 will get very close to each other in the core peripheral circuit, with the result that the induction of inductance components will become a serious problem. The inductance components are expected to become still greater, when yoke wiring lines are used.

As described above, in the conventional MRAM, when the bit line and the word lines are arranged closely one another to decrease the write current, this causes the wiring lines in the core peripheral circuit to get closer to one another, which can permit inductance components to induce. There is a possibility that interference caused by electromotive force between wiring lines arranged closely one another will become a problem.

BRIEF SUMMARY OF THE INVENTION

According to a first aspect of the present invention, there is provided a magnetic memory device comprising: a memory cell which includes a first wiring line composed of a first wiring layer, a second wiring line composed of a second wiring layer and provided above or below the first wiring line so as to cross the first wiring line, and a magnetoresistive effect element device provided in a position where the first wiring line and the second wiring line cross each other; and a peripheral circuit which includes a third wiring line provided around the memory cell and composed of the first wiring layer, a fourth wiring line provided above or below the third wiring line and composed of the second wiring layer, and at least one magnetic layer forming the magnetoresistive effect element device and provided between the third wiring line and the fourth wiring line.

According to a second aspect of the present invention, there is provided a magnetic memory device manufacturing method comprising: forming a first wiring line in a memory cell and a third wiring line in a peripheral circuit out of a first wiring layer; forming a magnetoresistive effect element device with at least one magnetic layer corresponding to a part of the first wiring line and also leaving the at least one magnetic layer so as to correspond to the third wiring line; and forming a second wiring layer into not only a second wiring line crossing the first wiring line in a position where the magnetoresistive effect element device is to be formed but also a fourth wiring line at least a part of which overlaps with the third wiring line via the at least one magnetic layer.

BRIEF DESCRIPTION OF THE SEVERAL VIEWS OF THE DRAWING

FIG. 2 is a sectional view to help explain a step in a method of manufacturing the magnetic memory device of FIG. 1;

FIG. 3 is a sectional view to help explain a step in the method of manufacturing the magnetic memory device of FIG. 1;

FIG. 4 is a sectional view to help explain a step in the method of manufacturing the magnetic memory device of FIG. 1;

FIG. 8 is a sectional view to help explain a step in the method of manufacturing the magnetic memory device of FIG. 1;

FIG. 9 is a sectional view to help explain a step in the method of manufacturing the magnetic memory device of FIG. 1;

FIG. 10 is a sectional view to help explain a step in the method of manufacturing the magnetic memory device of FIG. 1;

FIG. 18 is a sectional view to help explain a step in the method of manufacturing the magnetic memory device of FIG. 11;

FIG. 19 is a sectional view to help explain a step in the method of manufacturing the magnetic memory device of FIG. 11;

FIG. 20 is a sectional view to help explain a step in the method of manufacturing the magnetic memory device of FIG. 11;

FIG. 24 is a sectional view of a major part showing the basic configuration of a magnetic memory device (MRAM) according to a third embodiment of the present invention;

FIG. 37 is a sectional view of a major part showing another configuration of the magnetic memory device (MRAM) according to the fourth embodiment;

FIG. 40 is a sectional view of a major part showing a configuration of a magnetic memory device (MRAM) according to a sixth embodiment of the present invention;

FIG. 43 is a block diagram showing a configuration of a cellular phone terminal to which a magnetic memory device (MRAM) of the seventh embodiment is applied;

DETAILED DESCRIPTION OF THE INVENTION

Hereinafter, referring to the accompanying drawings, embodiments of the present invention will be explained.

[First Embodiment]

Figure 1:
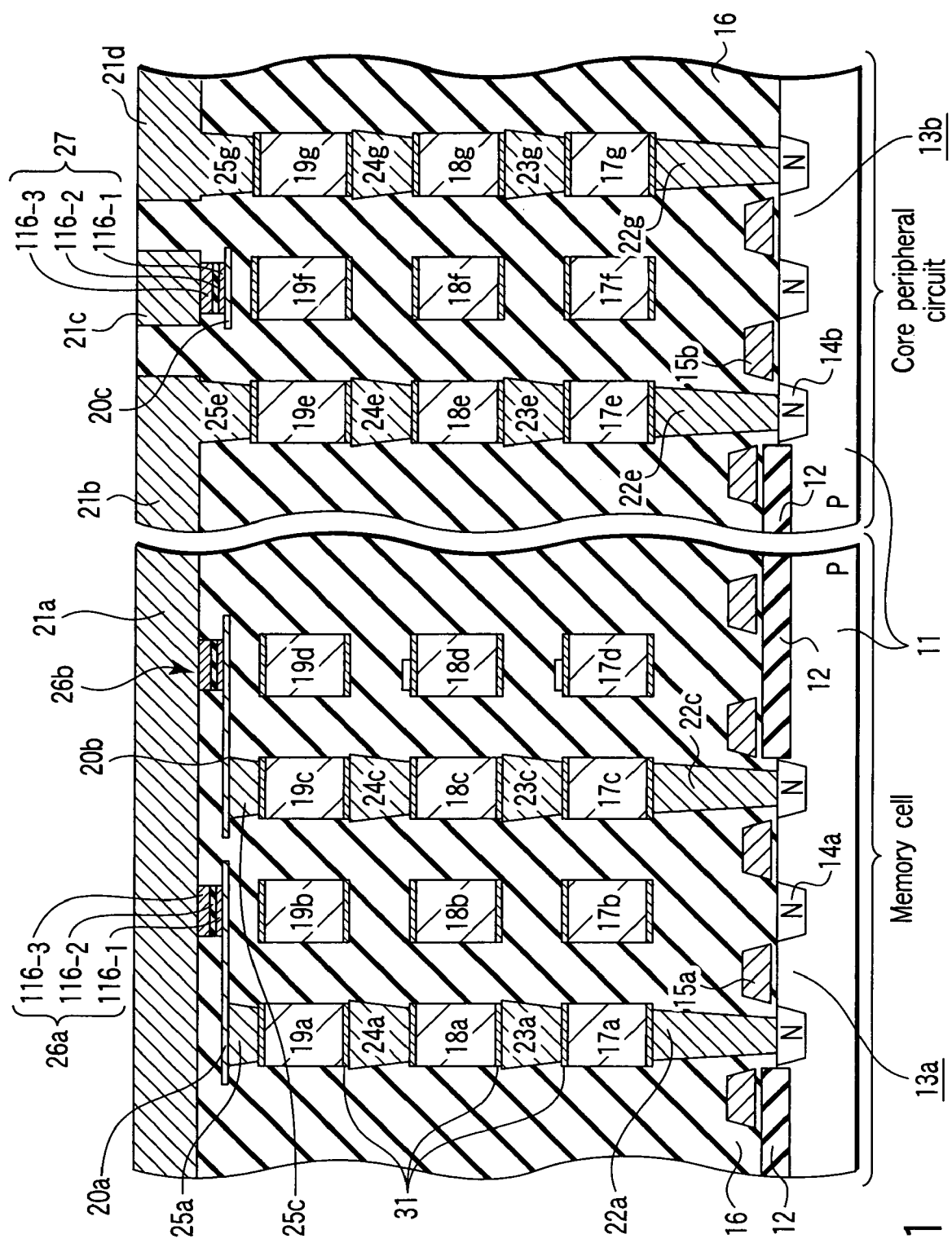
FIG. 1 is a sectional view of a major part showing the basic configuration of a magnetic memory device (MRAM) according to a first embodiment of the present invention.

FIG. 1 shows an example of the configuration of a magnetic memory device (hereinafter, abbreviated as an MRAM) according to a first embodiment of the present invention. Explanation will be given about a case where the induction of inductance components due to the wiring lines getting closer to one another in the peripheral circuit is suppressed by using a magnetic material with the same MTJ structure as that of a TMR element device, when the bit lines and the write word lines are arranged close to one another to reduce the write current.

The MRAM has a memory cell array structure (memory cell) and a core peripheral circuit for controlling the memory cell. The MRAM enables data to be written into and read from a desired TMR element device by random access to any cell (selected cell). In the memory cell, a plurality of memory unit cells (MRAM cells) are arranged in a matrix. Each of the memory cells has a TMR element device used as a memory element device. The core peripheral circuit, which includes a decoder and a sense circuit, is provided around, for example, the memory cell.

Specifically, as shown in FIG. 1, for example, in the surface of a p-type semiconductor substrate (or well) 11, a plurality of isolations 12 with an STI structure are formed. In each device region excluding the plurality of isolations 12, a plurality of MOSFETs 13a, 13b are provided. That is, in the surface of the p-type semiconductor substrate 11 corresponding to the memory cell demarcated by the plurality of isolations 12, for example, a plurality of n-type diffused layers 14a are selectively formed. On the surface of the p-type semiconductor substrate 11 between the plurality of diffused layers 14a, a plurality of gate electrodes 15a are each provided through a gate oxide film. Similarly, in the surface of the p-type semiconductor substrate 11 corresponding to the core peripheral circuit demarcated by the plurality of isolations 12, for example, a plurality of n-type diffused layers 14b are selectively formed. On the surface of the p-type semiconductor substrate 11 between the plurality of diffused layers 14b, a plurality of gate electrodes 15b are each provided through a gate oxide film.

On the p-type semiconductor substrate 11, an insulator film (e.g., TEOS: TetraEthoxy Silane) 16 is provided. In the insulator film 16, a plurality of wiring lines and contact plugs are formed. In the insulator film 16 of the memory cell, for example, there are provided wiring lines 17a, 17b, 17c, 17d in a first level, wiring lines 18a, 18b, 18c, 18d in a second level, wiring lines 19a, 19b, 19c, 19d in a third level, wiring lines 20a, 20b in a fourth level, and a wiring line 21a in a fifth level. In the insulator film 16 of the core peripheral circuit, for example, there are provided wiring lines 17e, 17f, 17g in the first level, wiring lines 18e, 18f, 18g in the second level, wiring lines 19e, 19f, 19g in the third level, a wiring line 20c in the fourth level, and wiring lines 21b, 21c, 21d in the fifth level. A barrier metal film 31 is provided on the top and bottom of each of at least the wiring lines 17a, 17b, 17c, 17d, 17e, 17f, 17g in the first level, the wiring lines 18a, 18b, 18c, 18d, 18e, 18f, 18g in the second level, and the wiring lines 19a, 19b, 19c, 19d, 19e, 19f, 19g in the third level.

Furthermore, in the insulator film 16, for example, there are provided first contact plugs 22a, 22c, 22e, 22g which connect the plurality of diffused layers 14a, 14b with the wiring lines 17a, 17c, 17e, 17g in the first level. Additionally, in the insulator film 16, for example, there are provided second contact plugs 23a, 23c, 23e, 23g which connect the wiring lines 17a, 17c, 17e, 17g in the first level with the wiring lines 18a, 18c, 18e, 18g in the second level, respectively. Moreover, in the insulator film 16, for example, there are provided third contact plugs 24a, 24c, 24e, 24g which connect the wiring lines 18a, 18c, 18e, 18g in the second level with the wiring lines 19a, 19c, 19e, 19g in the third level, respectively. Furthermore, in the insulator film 16, for example, there are provided fourth contact plugs 25a, 25c which connect the wiring lines 19a, 19c in the third level 109 with the wiring lines 20a, 20b in the fourth level, respectively, and fifth contact plugs 25e, 25g which connect the wiring lines 19e, 19g in the third level 109 with the wiring lines 21b, 21d in the fifth level, respectively.

In addition, for example, the wiring lines 20a, 20b in the fourth level are connected with the wiring line 21a in the fifth level via TMR element devices 26a, 26b. Furthermore, for example, the wiring line 20c in the fourth level is connected with the wiring line 21c in the fifth level via an MTJ film 27. That is, the MTJ film 27 is selectively provided between the wiring line 19f in the third level and the wiring line 21c in the fifth level. In the first embodiment, the MTJ film 27 is formed so as to have the same MTJ structure as that of the TMR element devices 26a, 26b.

Figure 51:
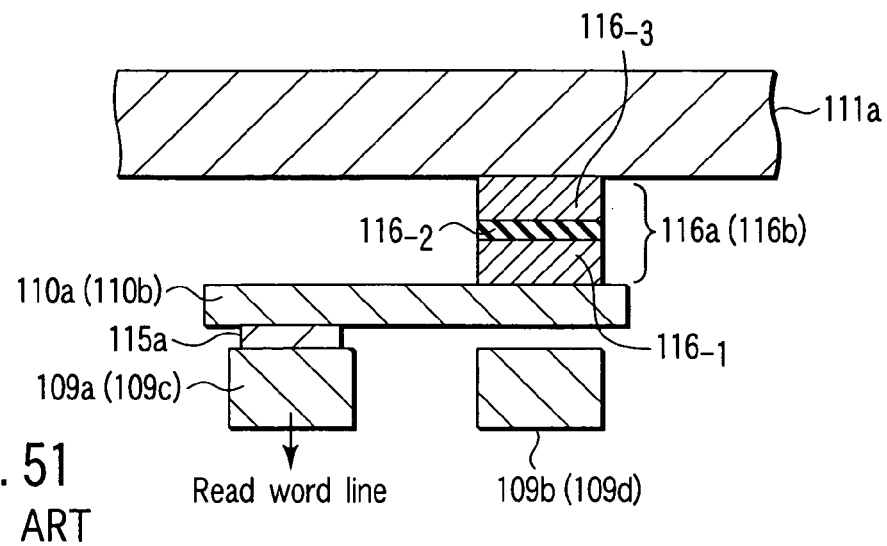
FIG. 51 is a sectional view showing a configuration of an MRAM cell (TMR element device), taking a conventional magnetic memory device as an example.
Figure 49:
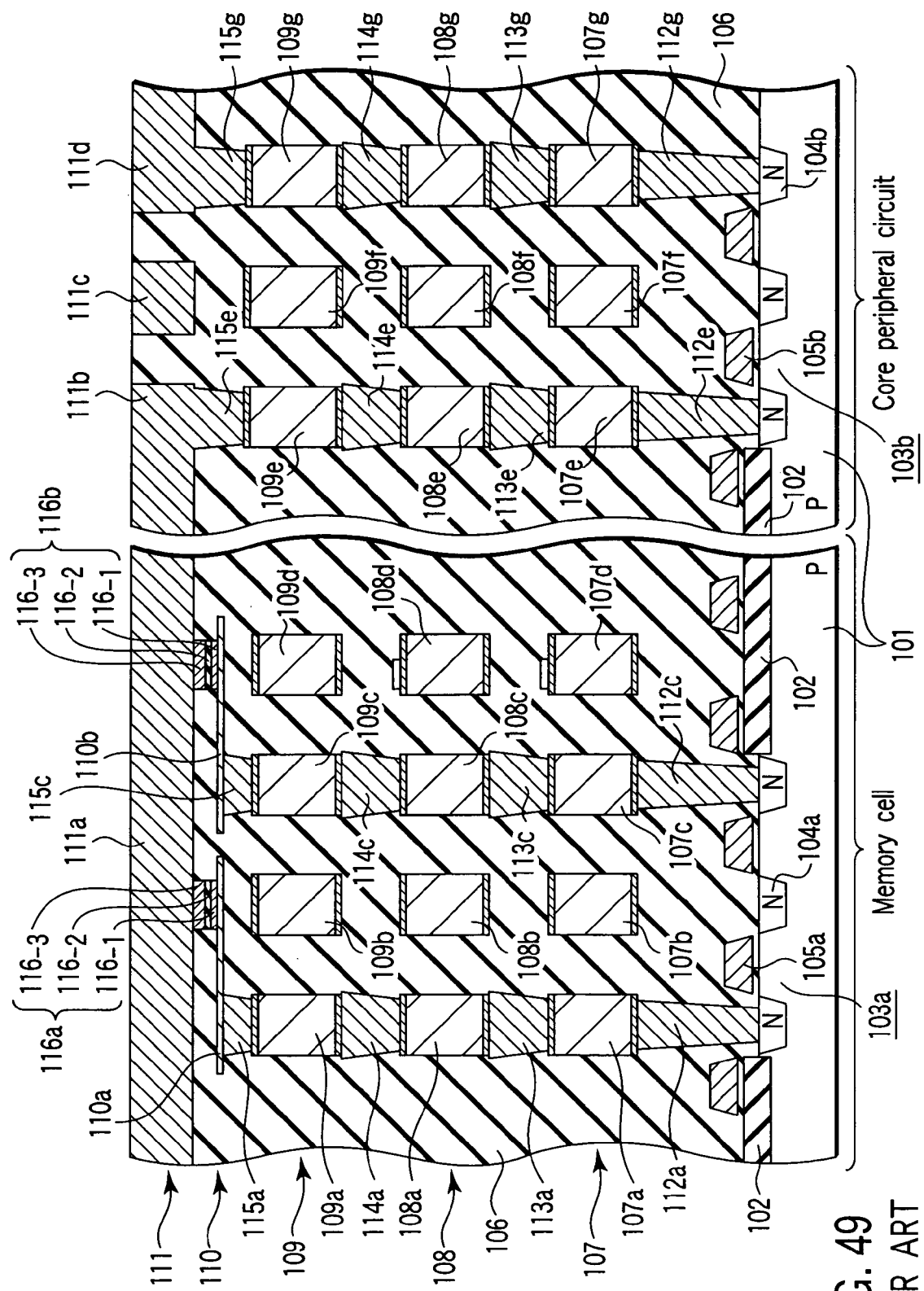
FIG. 49 is a sectional view of a magnetic memory device (MRAM) to help explain a conventional technique and its problem.

Each of the TMR element devices 26a, 26b and the MTJ film 27 has a three-layered structure (MTJ structure) composed of two magnetic layers and a nonmagnetic layer sandwiched between the two layers as shown in, for example, FIG. 51. Specifically, each of the TMR element devices 26a, 26b and the MTJ film 27 is configured in such a manner that, for example, a fixed magnetic layer (pin layer) $116_{-1}$ serving as a magnetic layer, a tunnel junction layer $116_{-2}$, serving as a nonmagnetic layer, and a magnetic recording layer (memory layer) $116_{-3}$ serving as a magnetic layer are stacked one on top of another in that order. The MTJ film 27 does not function as a memory element device for storing data.

In the MRAM with such a configuration, the wiring line 21a in the fifth level connected to the TMR element devices 26a, 26b functions as a bit line. The wiring lines 19b, 19d in the third level line not connected to the wiring lines 20a, 10b in the fourth level function as write word lines. The write word lines 19b, 19d are arranged perpendicular to the bit line 21a. Then, the TMR element devices 26a, 26b, which are placed at the intersections of the bit line 21a and the write word lines 19b, 19d, are used as memory element devices. The MOSFET 13a, which is connected electrically to the TMR element devices 26a, 26b, functions as a switching element. The gate electrode 15a of the MOSFET 13a functions as a read word line.

On the other hand, the MTJ film 27 in the core peripheral circuit is used to suppress the induction of inductance between the wiring line 19f in the third level and the wiring line 21c in the fifth level. In the first embodiment, the wiring line 19f in the third level and the wiring line 21c in the fifth level are both arranged to be perpendicular to the bit line 21a. The position in which the MTJ film 27 is selectively formed between the wiring line 19f in the third level and the wiring line 21c in the fifth level is a site where the induction of inductance is undesirable from the viewpoint of circuit characteristics. In the site, the effect of capacitance or the like is relatively little.

With such a configuration, even if the wiring line 19f in the third level and the wiring line 21c in the fifth level get much closer to each other in the core peripheral circuit, the effect of inductance caused by the wiring lines can be avoided by the MTJ film 27. Specifically, even if the bit line 21a and the write word lines 19b, 19d are arranged closer to one another to decrease the write current, the MTJ film 27 reduces the interference caused by electromotive force between the wiring lines 19f, 21c arranged closely to each other.

Next, a method of manufacturing an MRAM with the above configuration will be explained. Since the manufacturing processes up to the fourth contact plugs 25a, 25c are the same as in the prior art, a detailed explanation of the corresponding part will be omitted. After the wiring lines 19a, 19b, 19c, 19d, 19e, 19f, 19g in the third level and the metal film 31 on the wiring lines 19a, 19b, 19c, 19d, 19e, 19f, 19g are formed, an insulator film 16a is formed on the whole surface (memory cell and core peripheral circuit).

Then, in the insulator film 16a whose surface is planarized, fourth contact plugs 25a, 25c connected through a metal film 32 to the wiring lines 19a, 19c in the third level are formed. Thereafter, on the whole surface, a metal film 20, a three-layered structure film 116 composed of a magnetic layer, a nonmagnetic layer, and a magnetic layer, and a resist film 33 are formed in that order (for example, see FIG. 3). Then, the resist film 33 is patterned, thereby forming a mask pattern 33a in the part where the TMR element devices 26a, 26b and the MTJ film 27 are to be formed (for example, see FIG. 4).

Figure 5:
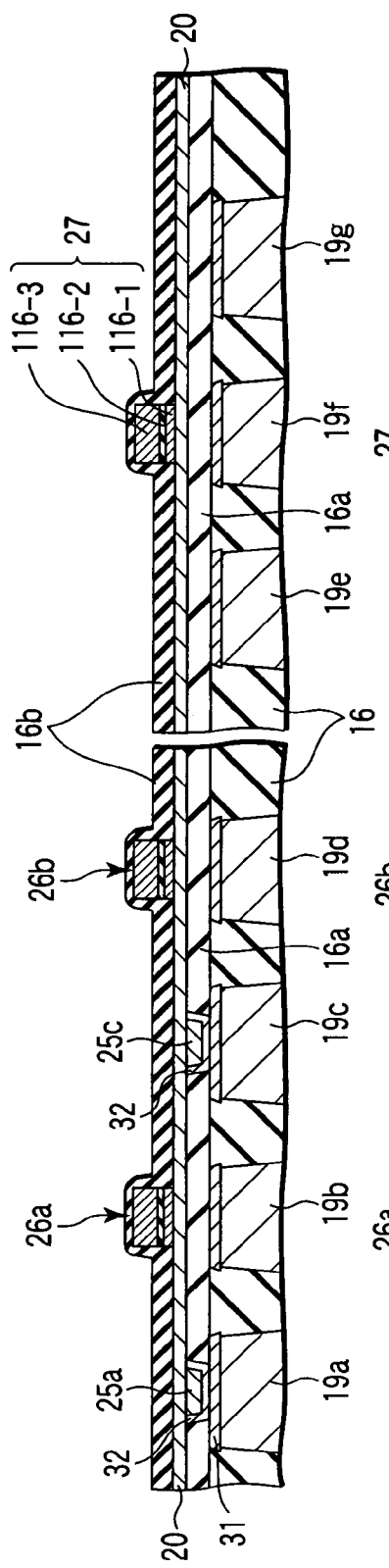
FIG. 5 is a sectional view to help explain a step in the method of manufacturing the magnetic memory device of FIG. 1.
Figure 6:
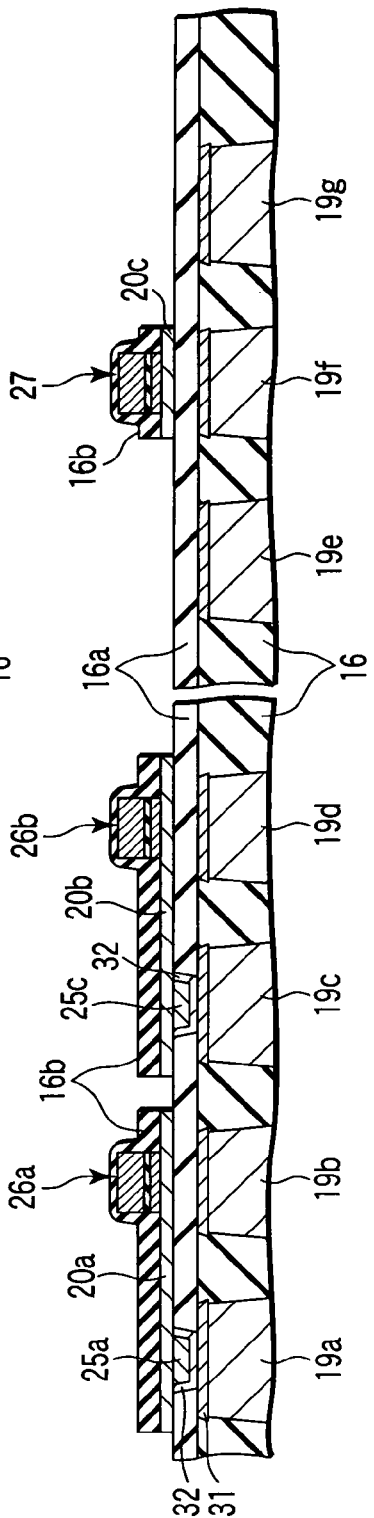
FIG. 6 is a sectional view to help explain a step in the method of manufacturing the magnetic memory device of FIG. 1.

Next, using the mask pattern 33a as a mask, the three-layered structure film 116 is selectively etched, thereby patterning a fixed magnetic layer $116_{-1}$, a tunnel junction layer $116_{-2}$, and a magnetic recording layer $116_{-3}$, which become the TMR element devices 26a, 26b, and the MTJ film 27, respectively. Thereafter, an insulator film 16b is formed on the whole surface (for example, see FIG. 5). Then, the insulator film 16b and the metal film 20 are patterned, thereby forming the wiring lines 20a, 20b, 20c in the fourth level connected to the TMR element devices 26a, 26b and the MTJ film 27, respectively (for example, see FIG. 6).

Figure 7:
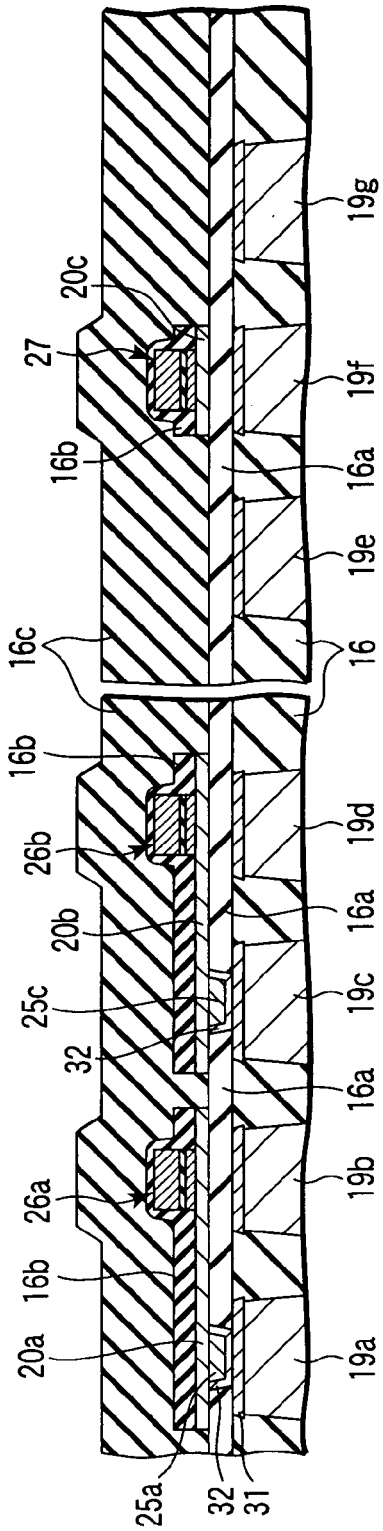
FIG. 7 is a sectional view to help explain a step in the method of manufacturing the magnetic memory device of FIG. 1.

Next, for example, as shown in FIG. 7, after an insulator film 16c is formed on the whole surface, the insulator films 16c, 16b are planarized by CMP (Chemical Mechanical Polishing), with the result that the surface of the magnetic recording layer $116_{-3}$ of each of the TMR element devices 26a, 26b and MTJ film 27 is exposed (for example, see FIG. 8). Then, contact holes 34, 34 connecting to the wiring lines 19e, 19g in the third level are made in the insulator films 16c, 16a (for example, see FIG. 9). Then, for example, as shown in FIG. 10, metal films 35, 21, 36 are formed on the whole surface. Next, the metal films 35, 21, 36 are processed, thereby forming not only the wiring lines 21a, 21b, 21c, 21d in the fifth level but also fifth contact plugs 25e, 25g connecting to the wiring lines 19e, 19g in the third level. Thereafter, an insulator film is formed on the whole surface. The surface is then planarized, which completes an MRAM with the configuration shown in FIG. 1.

As described above, the effect of inductance between wiring lines closely arranged one another is avoided without adding a particular process. Specifically, in the MRAM including the memory cell and the core peripheral circuit, the MTJ film 27 with the same MTJ structure as that of the TMR element devices 26a, 26b is provided between the wiring lines 19f, 21c located one above the other in the core peripheral circuit. This arrangement makes it possible to suppress the generation of electromotive force caused by the wiring lines 19f, 21c getting closer to each other in the core peripheral circuit, even when the bit line 21a and write word lines 19b, 19d are provided close to one another to reduce the write current. Therefore, the interference caused by electromotive force between the wiring lines 19f, 21c closely arranged each other can be reduced.

Moreover, it is possible to form the TMR element devices 26a, 26b and the MTJ film 27 automatically at the same time. Specifically, the MTJ film 27 can be formed easily by only designing a mask pattern so that the three-layered structure film 116 constituting the TMR element devices 26a, 26b may be also left in a specific site in the core peripheral circuit in the lithography process for patterning the TMR element devices 26a, 26b. Consequently, the cost performance does not get worse due to, for example, the addition of a particular process.

As for the formation of the MTJ film 27, it is desirable not only to avoid the contact part (plug formation position) between the wiring line 19f in the third level and the wiring line 21c in the fifth level but also to perform patterning so as to maximize the effect of suppressing inductance, taking the capacitance between wiring lines into account.

[Second Embodiment]

Figure 11:
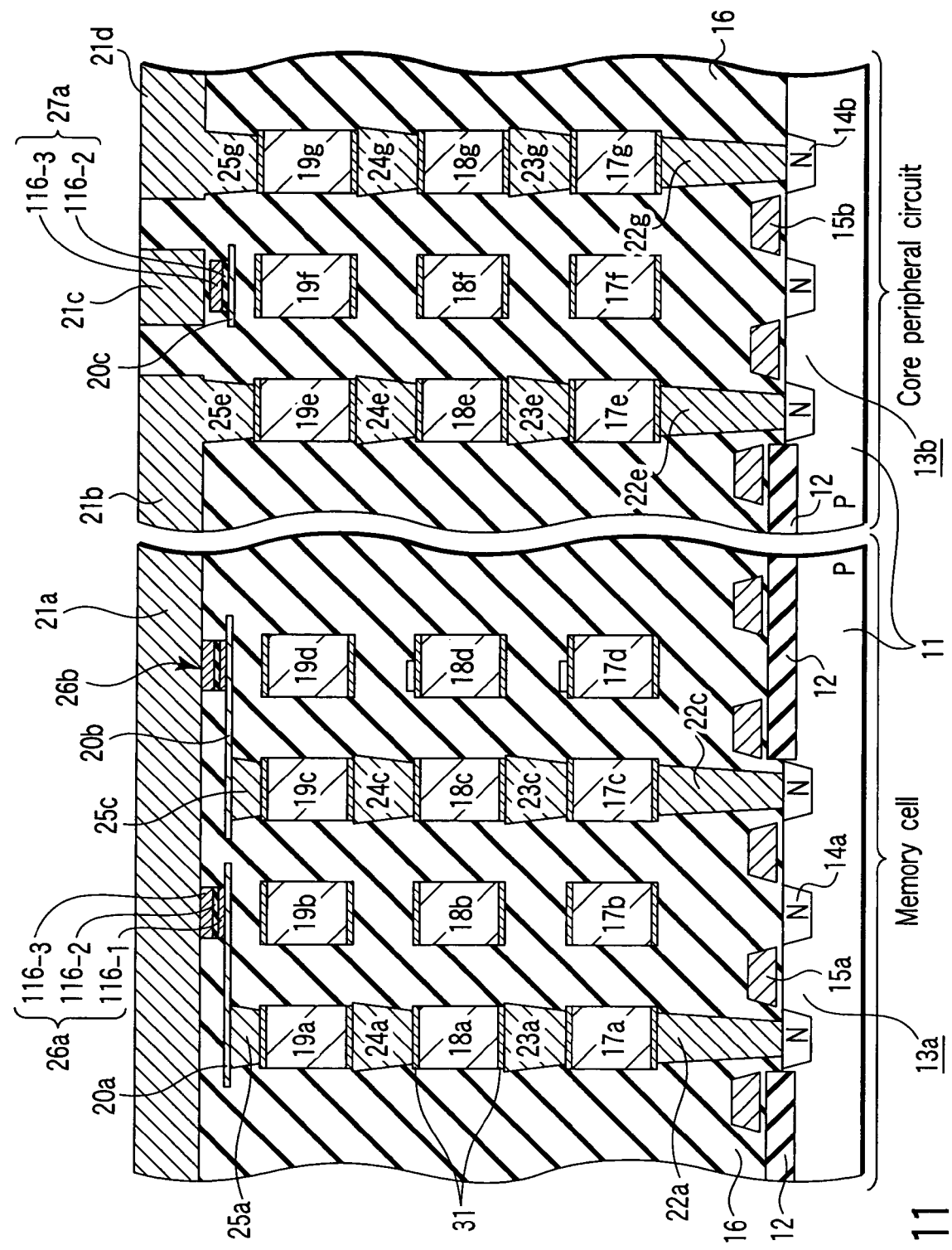
FIG. 11 is a sectional view of a major part showing the basic configuration of a magnetic memory device (MRAM) according to a second embodiment of the present invention.

FIG. 11 shows an example of the configuration of an MRAM according to a second embodiment of the present invention. Explanation will be given about a case where the magnetic layers (magnetic materials) of a part of a plurality of films constituting TMR element devices are used to suppress the induction of inductance components due to the wiring lines getting closer to one another in the peripheral circuit in arranging the bit line and the word write lines close to one another to reduce the write current. In FIG. 11, the sama parts as those in FIG. 1 are indicated by the same reference numerals and a detailed explanation of them will be omitted.

In the second embodiment, for example, the wiring lines 20a, 20b in the fourth level are connected to the wiring line 21a in the fifth level via the TMR element devices 26a, 26b, respectively. On the other hand, although an MTJ film 27a is provided on the wiring line 20c in the fourth level, the wiring line 20c in the fourth level is not connected electrically to the wiring line 21c in the fifth level. Specifically, as shown in FIG. 51, each of the TMR element devices 26a, 26b is configured in such a manner that, for example, a fixed magnetic layer (pin layer) $116_{-1}$ serving as a magnetic layer, a tunnel junction layer $116_{-2}$ serving as a nonmagnetic layer, and a magnetic recording layer (memory layer) $116_{-3}$ serving as a magnetic layer are stacked one on top of another in that order. In contrast, on the wiring line 20c in the fourth level between the wiring line 19f in the third level and the wiring line 21c in the fifth level, the MTJ film 27a composed of the tunnel junction layer $116_{-2}$ and the magnetic recording layer (magnetic film) $116_{-3}$ is selectively provided. Specifically, of the fixed magnetic layer $116_{-1}$, tunnel junction layer $116_{-2}$, and magnetic recording layer $116_{-3}$ that constitute the TMR element devices 26a, 26b, the MTJ film 27a is composed only of the tunnel junction layer $116_{-2}$ and magnetic recording layer $116_{-3}$ excluding the fixed magnetic layer $116_{-1}$.

Even with such a configuration, it is possible to avoid the effect of inductance due to the wiring line 19f in the third level and the wiring line 21c in the fifth level getting closer to each other in the core peripheral circuit as in the first embodiment. Specifically, even when the bit line 21a is arranged closely to the write word lines 19b, 19d to reduce the write current, the MTJ film 27a reduces the interference caused by electromotive force between the wiring lines 19f, 21c closely arranged each other.

Figure 12:
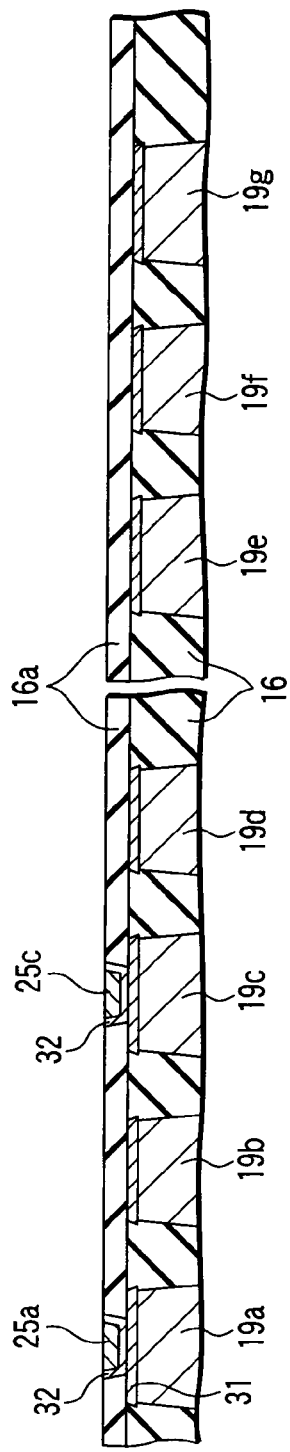
FIG. 12 is a sectional view to help explain a step in a method of manufacturing the magnetic memory device of FIG. 11.

Next, a method of manufacturing an MRAM with the above configuration will be explained. Since the manufacturing processes up to the fourth contact plugs 25a, 25c are the same as in the prior art, a detailed explanation of them will be omitted. After the wiring lines 19a, 19b, 19c, 19d, 19e, 19f, 19g in the third level and the metal film 31 on the wiring lines 19a, 19b, 19c, 19d, 19e, 19f, 19g are formed, an insulator film 16a is formed on the whole surface (memory cell and core peripheral circuit) as shown in, for example, FIG. 12.

Figure 13:
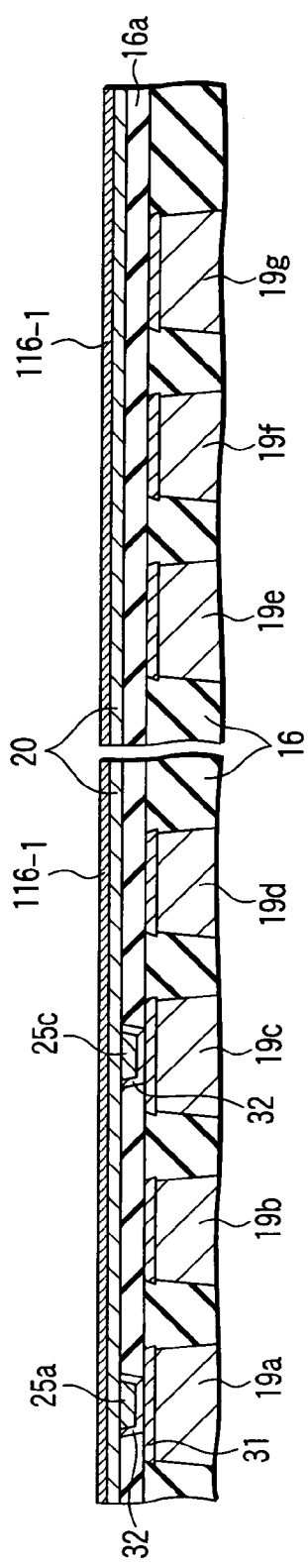
FIG. 13 is a sectional view to help explain a step in the method of manufacturing the magnetic memory device of FIG. 11.
Figure 14:
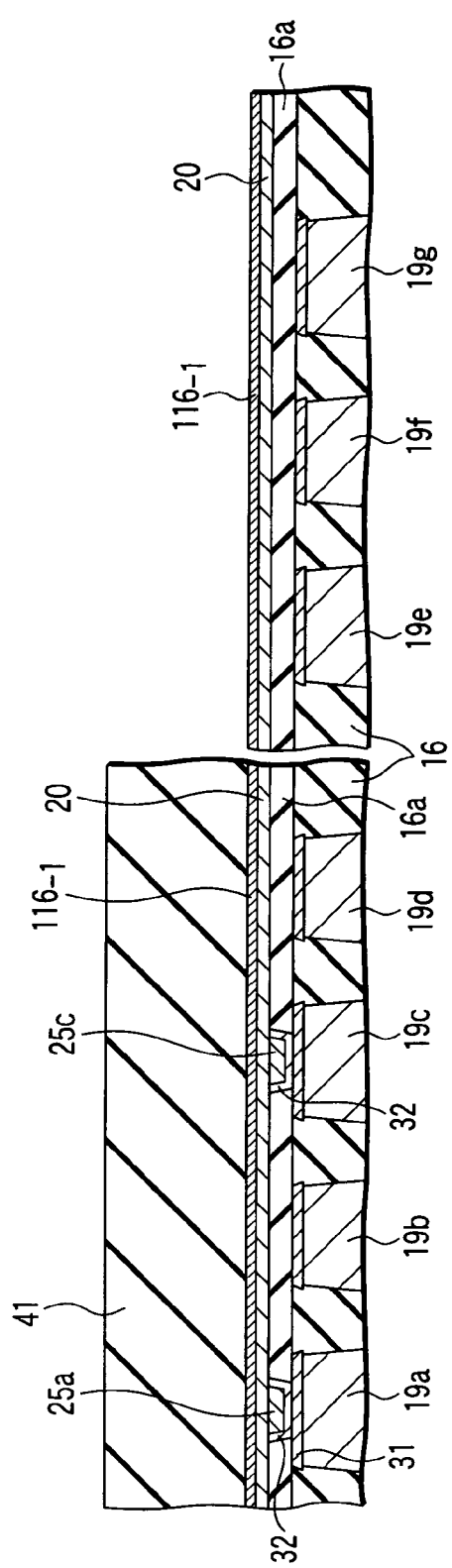
FIG. 14 is a sectional view to help explain a step in the method of manufacturing the magnetic memory device of FIG. 11.
Figure 15:
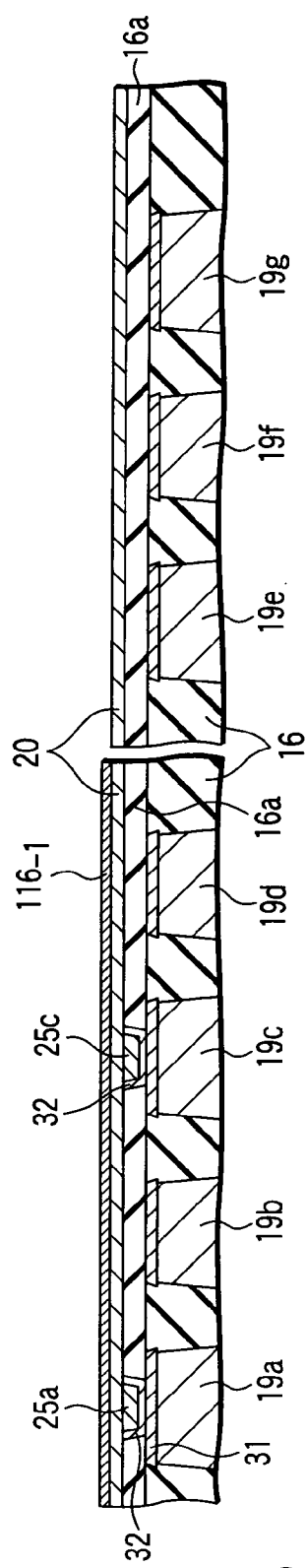
FIG. 15 is a sectional view to help explain a step in the method of manufacturing the magnetic memory device of FIG. 11.

Then, in the insulator film 16a whose surface is planarized, fourth contact plugs 25a, 25c connected via a metal film 32 to the wiring lines 19a, 19c in the third level are formed. Thereafter, on the whole surface, a metal film 20 and a fixed magnetic layer $116_{-1}$ are formed (for example, see FIG. 13). Then, a resist film 41 is formed only on the memory cell (for example, see FIG. 14). With the resist film 41 as a mask, all of the fixed magnetic layer $116_{-1}$ on the core peripheral circuit is removed (for example, see FIG. 15).

Figure 16:
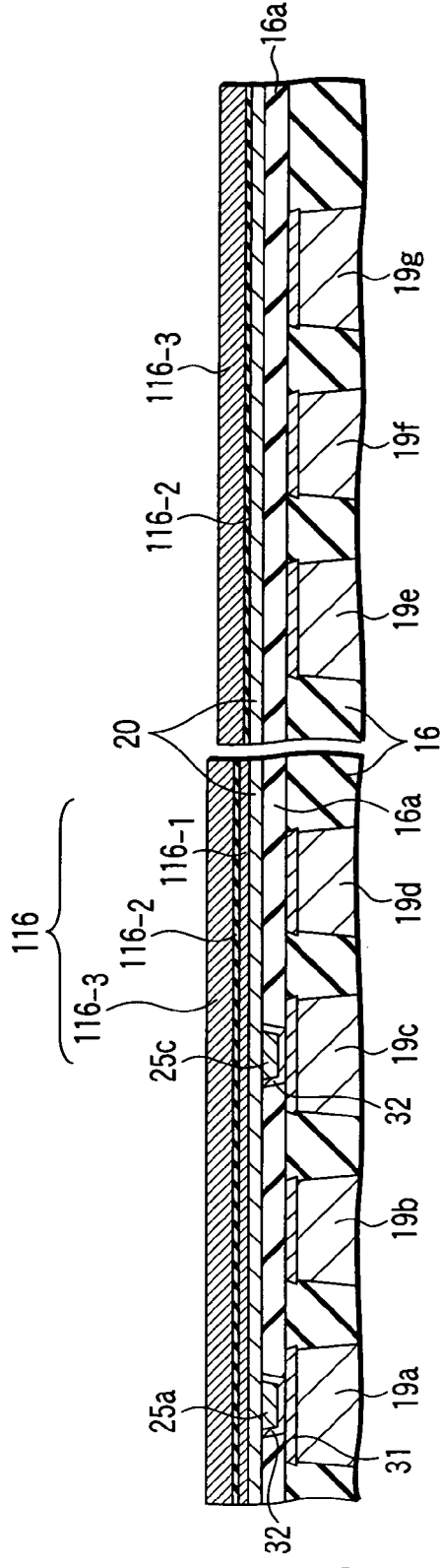
FIG. 16 is a sectional view to help explain a step in the method of manufacturing the magnetic memory device of FIG. 11.
Figure 17:
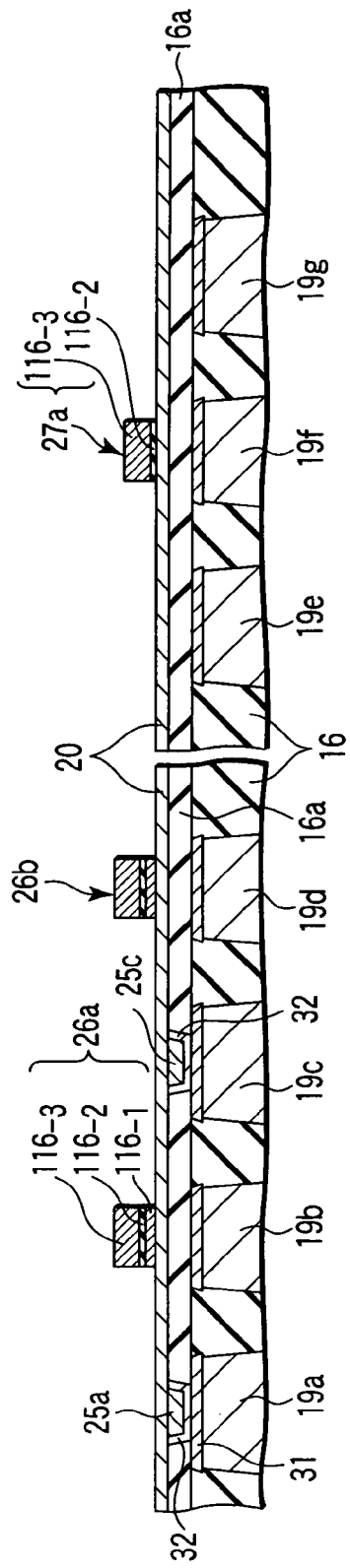
FIG. 17 is a sectional view to help explain a step in the method of manufacturing the magnetic memory device of FIG. 11.

Next, after the resist film 41 is removed, the tunnel junction layer $116_{-2}$ and magnetic recording layer $116_{-3}$ are formed in sequence on the whole surface as shown in, for example, FIG. 16. As a result, a three-layered structure film 116 is formed only on the memory cell. Then, the three-layered structure film 116 on the memory cell and the tunnel junction layer $116_{-2}$ and magnetic recording layer $116_{-3}$ on the core peripheral circuit are selectively etched, thereby forming the TMR element devices 26a, 26b and the MTJ film 27a (for example, see FIG. 17).

Figure 21:
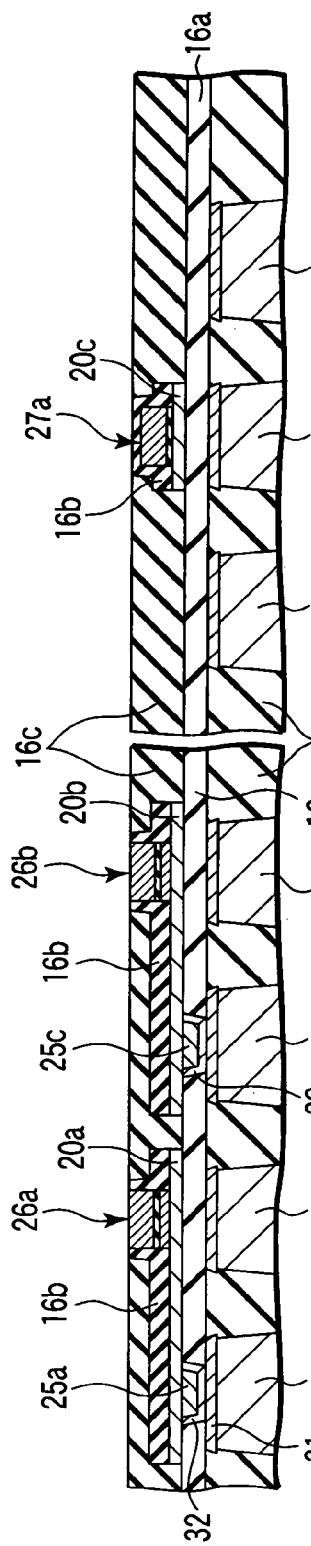
FIG. 21 is a sectional view to help explain a step in the method of manufacturing the magnetic memory device of FIG. 11.

Next, an insulator film 16b is formed on the whole surface as shown in, for example, FIG. 18. Then, the insulator film 16b and the metal film 20 are processed, thereby forming the wiring lines 20a, 20b, 20c in the fourth level connected to the TMR element devices 26a, 26b and the MTJ film 27a, respectively (for example, see FIG. 19). Then, for example, as shown in FIG. 20, after an insulator film 16c is formed on the whole surface, the insulator films 16c, 16b are processed by CMP, with the result that only the surface of the magnetic recording layer $116_{-3}$ of each of the TMR element devices 26a, 26b is exposed (for example, see FIG. 21).

Figure 22:
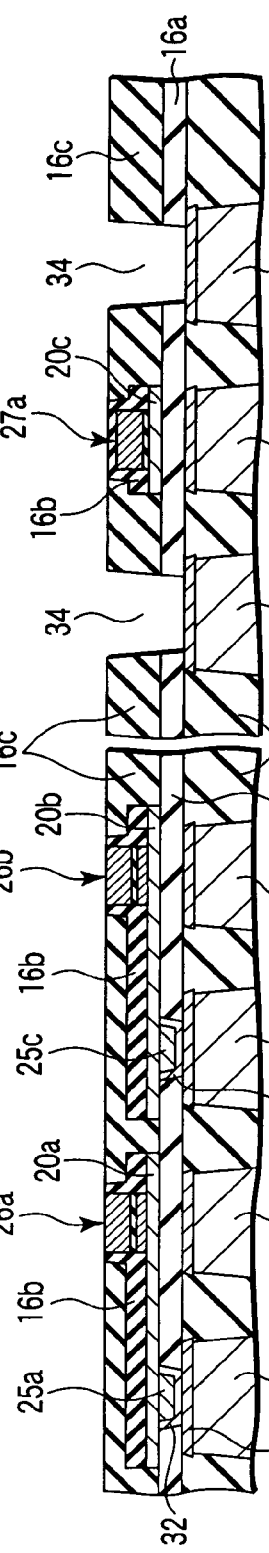
FIG. 22 is a sectional view to help explain a step in the method of manufacturing the magnetic memory device of FIG. 11.
Figure 23:
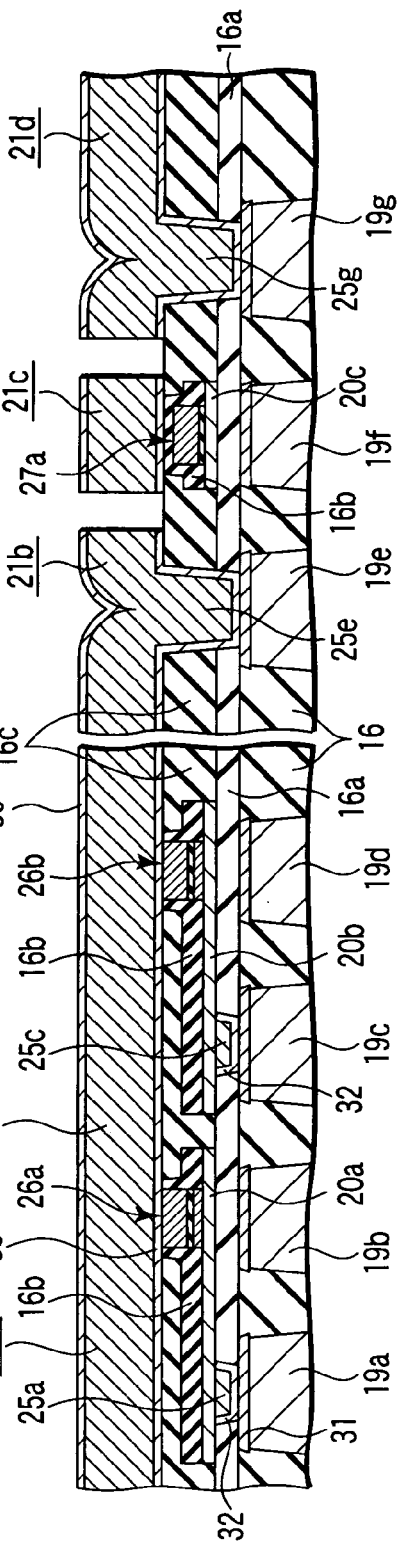
FIG. 23 is a sectional view to help explain a step in the method of manufacturing the magnetic memory device of FIG. 11.

From this step on, the wiring lines 21a, 21b, 21c, 21d in the fifth level and the fifth contact plugs 25e, 25g are formed as in the first embodiment. Specifically, contact holes 34, 34 connecting to the wiring lines 19e, 19g in the third level are made in the insulator films 16c, 16a (for example, see FIG. 22). Then, for example, as shown in FIG. 23, metal films 35, 21, 36 are formed on the whole surface. Next, the metal films 35, 21, 36 are patterned, thereby forming not only the wiring lines 21a, 21b, 21c, 21d in the fifth level but also fifth contact plugs 25e, 25g connecting to the wiring lines 19e, 19g in the third level. Thereafter, an insulator film is formed on the whole surface. The surface is then planarized, which completes an MRAM with the configuration shown in FIG. 11.

As described above, in the MRAM including the memory cell and the core peripheral circuit for controlling the memory cell, it is also possible to suppress the generation of electromotive force caused by the wiring lines 19f, 21c getting closer to each other in the core peripheral circuit by providing the MTJ film 27a including at least the magnetic recording layer $116_{-3}$ used for the formation of the TMR element devices 26a, 26b, between the wiring lines 19f, 21c located one above the other in the core peripheral circuit. In the second embodiment, too, since the MTJ film 27a can be formed easily, the cost performance does not get worse due to, for example, the addition of a particular process.

In the core peripheral circuit, when the three-layered structure film 116 is processed, the film is so thin that the junctions can be short-circuited due to the difference in processibility caused by variations in the pattern density. Therefore, it may be advantageous to leave only a part (in the second embodiment, the magnetic recording layer $116_{-3}$) of the three-layered structure film 116, from the viewpoint of processing.

In the second embodiment, the wiring line 20c in the fourth level and the wiring line 21c in the fifth level are not connected electrically, so that there is no possibility that the wiring line 20c in the fourth level and the wiring line 21c in the fifth level will be short-circuited. Specifically, the wiring line 21c in the fifth level is connected to the magnetic recording layer $116_{-3}$ through the insulator film 16b. Therefore, even in a cross-point cell whose write wiring line also serves as a read wiring line, the upper and lower wiring lines can be prevented from being connected to each other via a junction.

Furthermore, in the second embodiment, too, when the MTJ film 27a is formed, it is desirable that the contact part (or plug formation position) between the wiring line 19f in the third level and the wiring line 21c in the fifth level should be avoided and patterning should be done so as to maximize the effect of suppressing inductance, taking the capacitance between wiring lines into account.

[Third Embodiment]

FIG. 24 shows an example of the configuration of an MRAM according to a third embodiment of the present invention. Explanation will be given about another case where the magnetic layers (magnetic materials) of a part of a plurality of films constituting TMR element devices are used to suppress the induction of inductance components due to the wiring lines closely arranged one another in the peripheral circuit in arranging the bit line and the word write lines close to one another to reduce the write current. In FIG. 24, the sama parts as those in FIG. 11 are indicated by the same reference numerals and a detailed explanation of them will be omitted.

In the third embodiment, for example, the wiring lines 20a, 20b in the fourth level are connected to the wiring line 21a in the fifth level via the TMR element devices 26a, 26b. On the other hand, for example, although an MTJ film 27b is provided on the wiring line 20c in the fourth level, the wiring line 20c in the fourth level is not connected electrically to the wiring line 21c in the fifth level. Specifically, as shown in FIG. 51, each of the TMR element devices 26a, 26b is configured in such a manner that, for example, a fixed magnetic layer (pin layer) $116_{-1}$ serving as a magnetic layer, a tunnel junction layer $116_{-2}$ serving as a nonmagnetic layer, and a magnetic recording layer (memory layer) $116_{-3}$ serving as a magnetic layer are stacked one on top of another in that order. In contrast, on the wiring line 20c in the fourth level between the wiring line 19f in the third level and the wiring line 21c in the fifth level, the MTJ film 27b composed of the fixed magnetic layer (magnetic film) $116_{-1}$ is selectively provided. Specifically, of the fixed magnetic layer $116_{-1}$, tunnel junction layer $116_{-2}$, and magnetic recording layer $116_{-3}$ that constitute the TMR element devices 26a, 26b, the MTJ film 27b is composed only of the fixed magnetic layer $116_{-1}$ excluding the tunnel junction layer $116_{-2}$ and magnetic recording layer $116_{-3}$.

Even with such a configuration, it is possible to avoid the effect of inductance due to the wiring line 19f in the third level and the wiring line 21c in the fifth level getting closer to each other in the core peripheral circuit as in the first and second embodiments. Specifically, even when the bit line 21a is provided close to the write word lines 19b, 19d to reduce the write current, the MTJ film 27a reduces the interference caused by electromotive force between the wiring lines 19f, 21c closely arranged each other.

Figure 25:
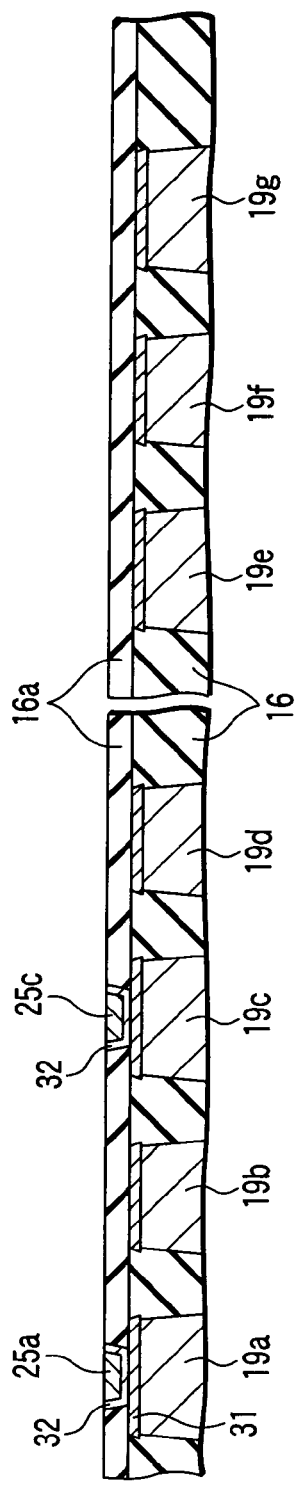
FIG. 25 is a sectional view to help explain a step in a method of manufacturing the magnetic memory device of FIG. 24.

Next, a method of manufacturing an MRAM with the above configuration will be explained. Since the manufacturing processes up to the fourth contact plugs 25a, 25c are the same as in the prior art, a detailed explanation of them will be omitted. After the wiring lines 19a, 19b, 19c, 19d, 19e, 19f, 19g in the third level and the metal film 31 on the wiring lines 19a, 19b, 19c, 19d, 19e, 19f, 19g are formed, an insulator film 16a is formed on the whole surface (memory cell and core peripheral circuit) as shown in, for example, FIG. 25.

Figure 26:
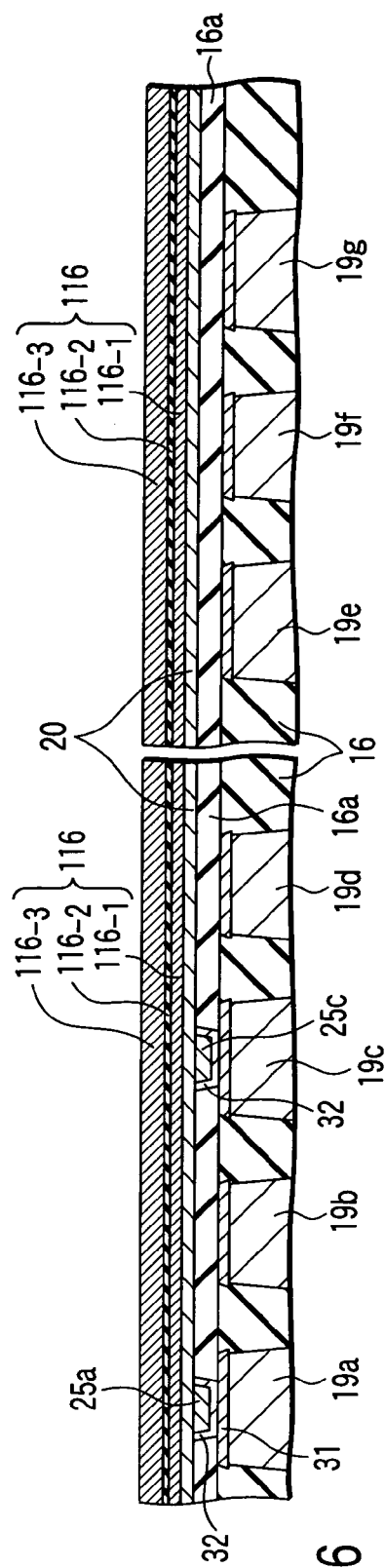
FIG. 26 is a sectional view to help explain a step in the method of manufacturing the magnetic memory device of FIG. 24.
Figure 27:
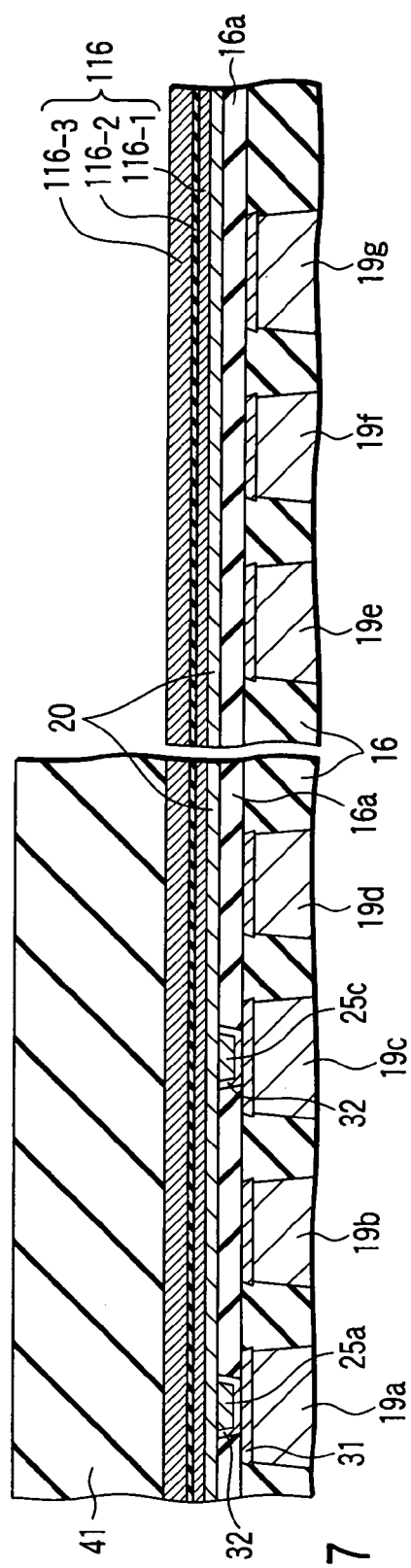
FIG. 27 is a sectional view to help explain a step in the method of manufacturing the magnetic memory device of FIG. 24.
Figure 28:
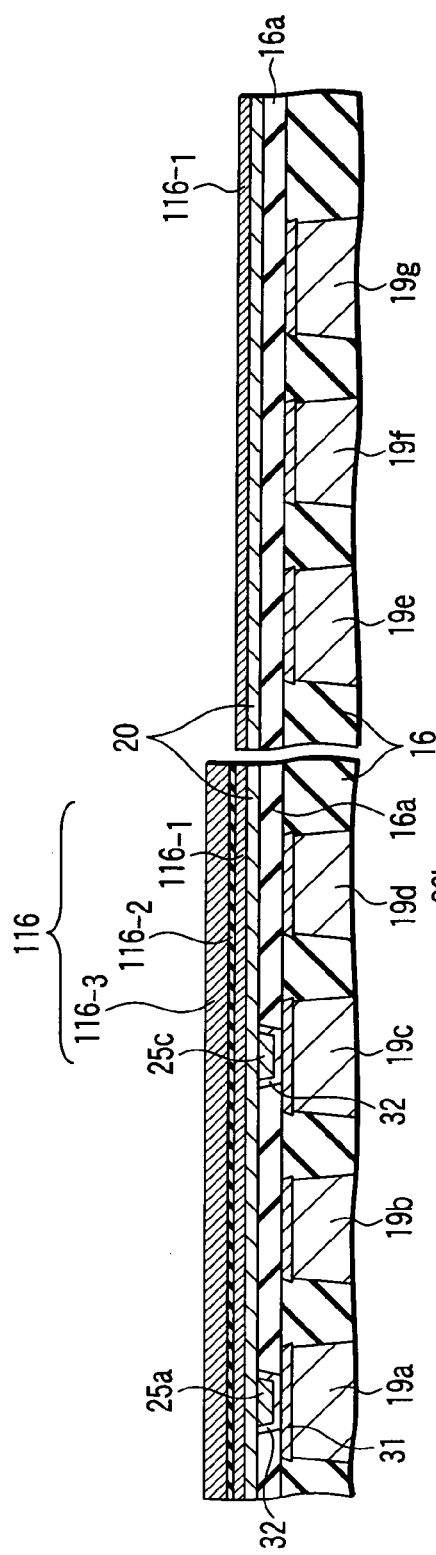
FIG. 28 is a sectional view to help explain a step in the method of manufacturing the magnetic memory device of FIG. 24.

Then, in the insulator film 16a whose surface is planarized, fourth contact plugs 25a, 25c connected via a metal film 32 to the wiring lines 19a, 19c in the third level are formed. Thereafter, on the whole surface, not only is a metal film 20 is formed, but also a three-layered structure film 116 composed of the fixed magnetic layer $116_{-1}$, tunnel junction layer $116_{-2}$, and magnetic recording layer $116_{-3}$ is formed (for example, see FIG. 26). Then, a resist film 41 is formed only on the memory cell (for example, see FIG. 27). With the resist film 41 as a mask, all of the tunnel junction layer $116_{-2}$, and magnetic recording layer $116_{-3}$ on the core peripheral circuit are removed (for example, see FIG. 28).

Figure 29:
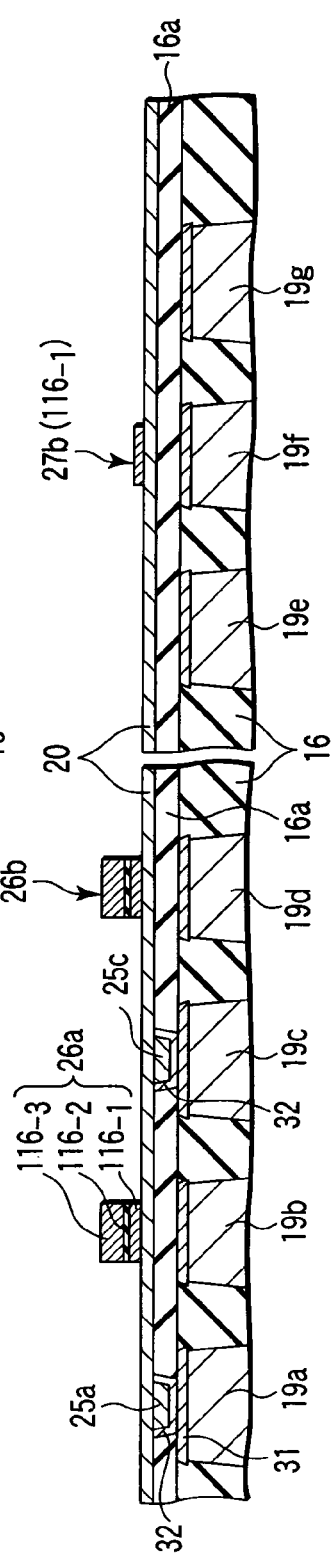
FIG. 29 is a sectional view to help explain a step in the method of manufacturing the magnetic memory device of FIG. 24.
Figure 30:
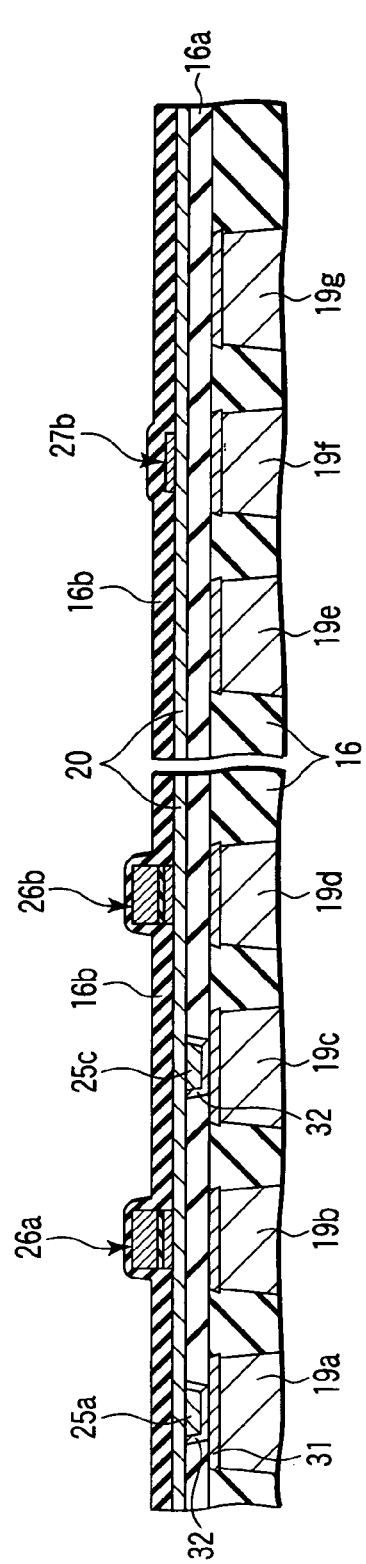
FIG. 30 is a sectional view to help explain a step in the method of manufacturing the magnetic memory device of FIG. 24.
Figure 31:
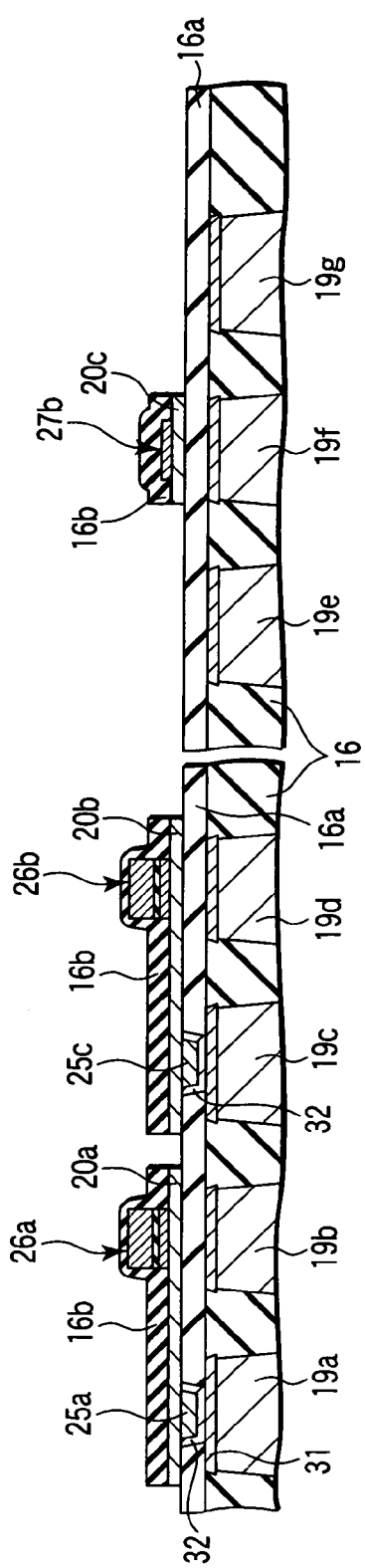
FIG. 31 is a sectional view to help explain a step in the method of manufacturing the magnetic memory device of FIG. 24.
Figure 32:
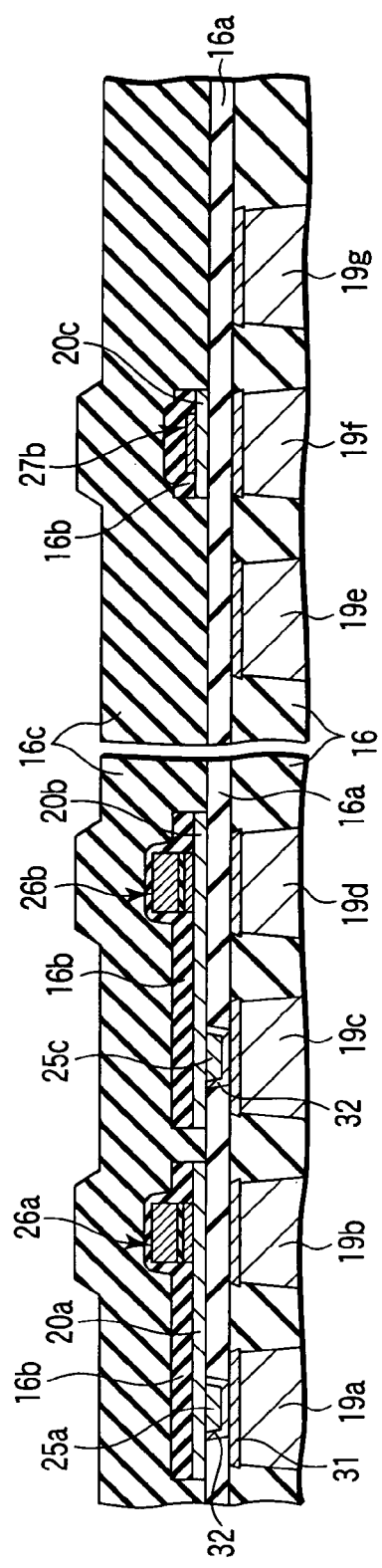
FIG. 32 is a sectional view to help explain a step in the method of manufacturing the magnetic memory device of FIG. 24.
Figure 33:
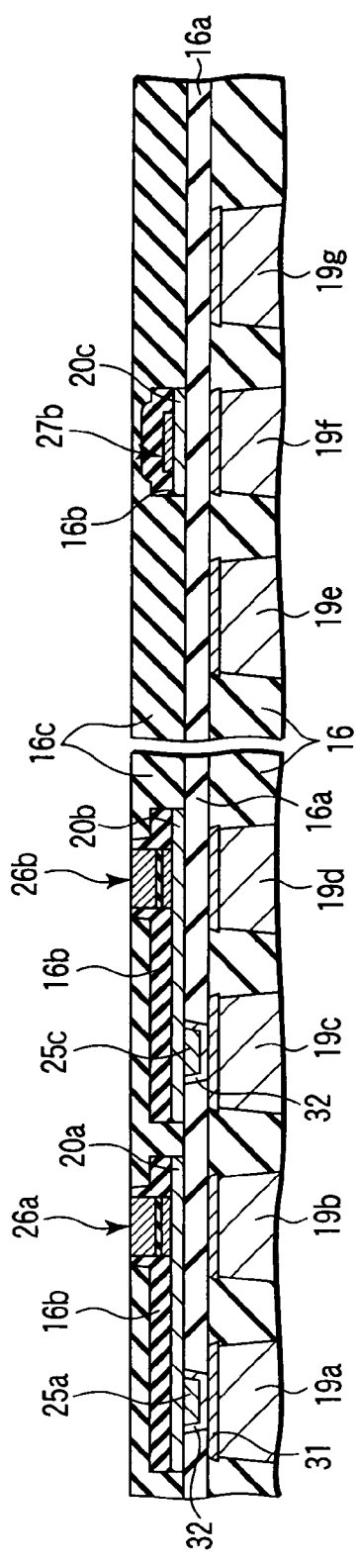
FIG. 33 is a sectional view to help explain a step in the method of manufacturing the magnetic memory device of FIG. 24.

Then, after the resist film 41 is removed, the three-layered structure film 116 in the memory cell and the fixed magnetic layer $116_{-1}$ on the core peripheral circuit are selectively etched, thereby forming the TMR element devices 26a, 26b and the MTJ film 27b as shown in FIG. 29. Then, on the whole surface, an insulator film 16b is formed (for example, see FIG. 30). Then, the insulator film 16b and the metal film 20 are patterned, thereby forming the wiring lines 20a, 20b, 20c in the fourth level connected to the TMR element devices 26a, 26b and the MTJ film 27b, respectively (for example, see FIG. 31). Next, for example, as shown in FIG. 32, after an insulator film 16c is formed on the whole surface, the insulator films 16c, 16b are planarized by CMP, with the result that only the surface of the magnetic recording layer $116_{-3}$ of each of the TMR element devices 26a, 26b is exposed (for example, see FIG. 33).

Figure 34:
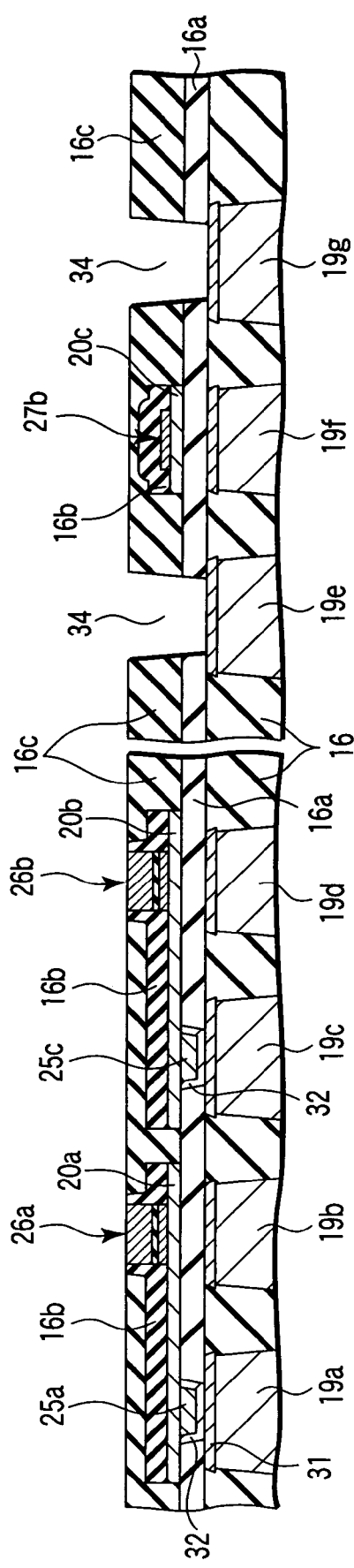
FIG. 34 is a sectional view to help explain a step in the method of manufacturing the magnetic memory device of FIG. 24.
Figure 35:
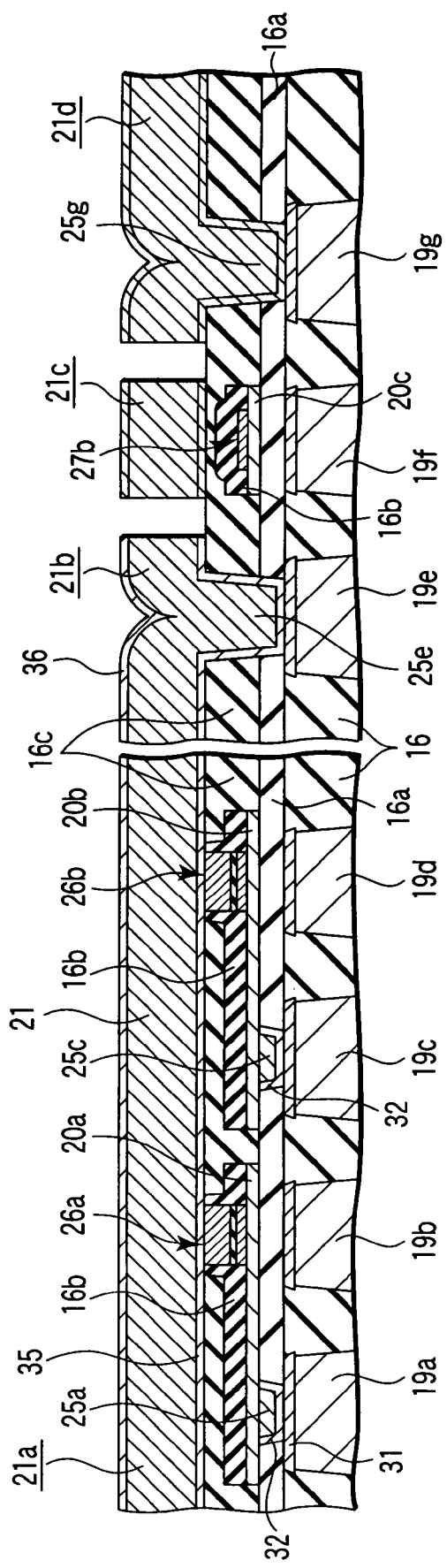
FIG. 35 is a sectional view to help explain a step in the method of manufacturing the magnetic memory device of FIG. 24.

From this step on, the wiring lines 21a, 21b, 21c, 21d in the fifth level and the fifth contact plugs 25e, 25g are formed as in the first and second embodiments. Specifically, contact holes 34, 34 connecting to the wiring lines 19e, 19g in the third level are made in the insulator films 16c, 16a (for example, see FIG. 34). Then, for example, as shown in FIG. 35, metal films 35, 21, 36 are formed on the whole surface. Next, the metal films 35, 21, 36 are processed, thereby forming not only the wiring lines 21a, 21b, 21c, 21d in the fifth level but also fifth contact plugs 25e, 25g connecting to the wiring lines 19e, 19g in the third level. Thereafter, an insulator film is formed on the whole surface. The surface is then planarized, which completes an MRAM with the configuration shown in FIG. 24.

As described above, in the MRAM including the memory cell and the core peripheral circuit for controlling the memory cell, it is also possible to suppress the generation of electromotive force due to the wiring lines 19f, 21c getting closer to each other in the core peripheral circuit by providing the MTJ film 27b including at least the fixed magnetic layer $116_{-1}$ used for the formation of the TMR element devices 26a, 26b, between the wiring lines 19f, 21c located one above the other in the core peripheral circuit. In the third embodiment, too, since the MTJ film 27b can be formed easily, the cost performance does not get worse due to, for example, the addition of a particular process.

In the core peripheral circuit, it may be advantageous to leave only a part (in the third embodiment, the fixed magnetic layer $116_{-1}$) of the three-layered structure film 116, from the viewpoint of processing as in the second embodiment. Additionally, in a cross-point cell whose write wiring line also serves as a read wiring line, the upper and lower wiring lines can be prevented from being connected to each other via a junction.

Furthermore, in the third embodiment, too, when the MTJ film 27a is formed, it is desirable that the contact part (or plug formation position) between the wiring line 19f in the third level and the wiring line 21c in the fifth level should be avoided and patterning should be done so as to maximize the effect of suppressing inductance, taking the capacitance between wiring lines into account.

[Fourth Embodiment]

Figure 36:
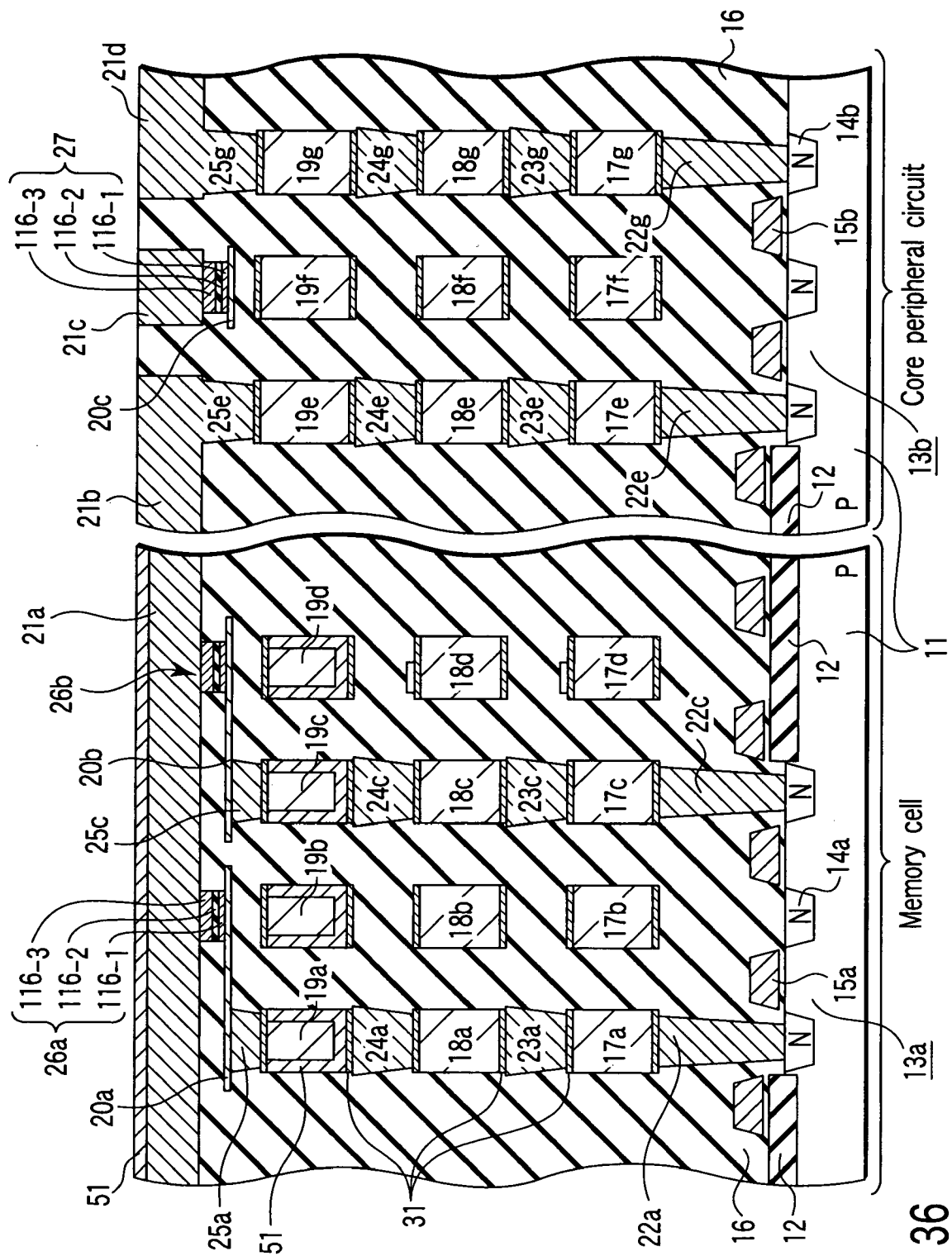
FIG. 36 is a sectional view of a major part showing a configuration of a magnetic memory device (MRAM) according to a fourth embodiment of the present invention.

FIGS. 36 and 37 show examples of the configuration of an MRAM according to a fourth embodiment of the present invention. Explanation will be given, taking an MRAM with yoke-structure wiring lines as an example. In FIGS. 36 and 37, the sama parts as those in FIG. 1 are indicated by the same reference numerals and a detailed explanation of them will be omitted. In the case of an MRAM with yoke-structure wiring lines, for example, each of the wiring lines 19a, 19b, 19c, 19d in the third level and the wiring line 21a in the fifth level at least on the memory cell is configured to have a magnetic film 51 as shown in FIG. 36. Specifically, each side of the wiring lines 19a, 19b, 19c, 19d in the third level and the wiring line 21a in the fifth level excluding the sides facing the TMR element devices 26a, 26b is covered with the magnetic film 51. Between the wiring line 19f in the third level and the wiring line 21c in the fifth level in the core peripheral circuit, an MTJ film 27 with the configuration described in the first embodiment is provided.

In the case of an MRAM with such a yoke wiring structure, magnetism is liable to concentrate between the wiring lines 19a, 19b, 19c, 19d in the third level and the wiring line 21a in the fifth level. That is, the effect of inductance is liable to induce between the wiring lines 19a, 19b, 19c, 19d in the third level and the wiring line 21a in the fifth level. Therefore, placing the MTJ film 27 between the wiring line 19f in the third level and the wiring line 21c in the fifth level in the core peripheral circuit makes it possible to avoid the effect of inductance effectively.

The MRAM using a yoke wiring structure may be configured so as to have such an additional magnetic film 51 as covers the three sides of each of the wiring lines 19e, 19f, 19g in the third level and the wiring lines 21b, 21c, 21d in the fifth level in the core peripheral circuit as shown in FIG. 37. The MRAM with this configuration also produces the same effect as the first embodiment.

[Fifth Embodiment]

Figure 38:
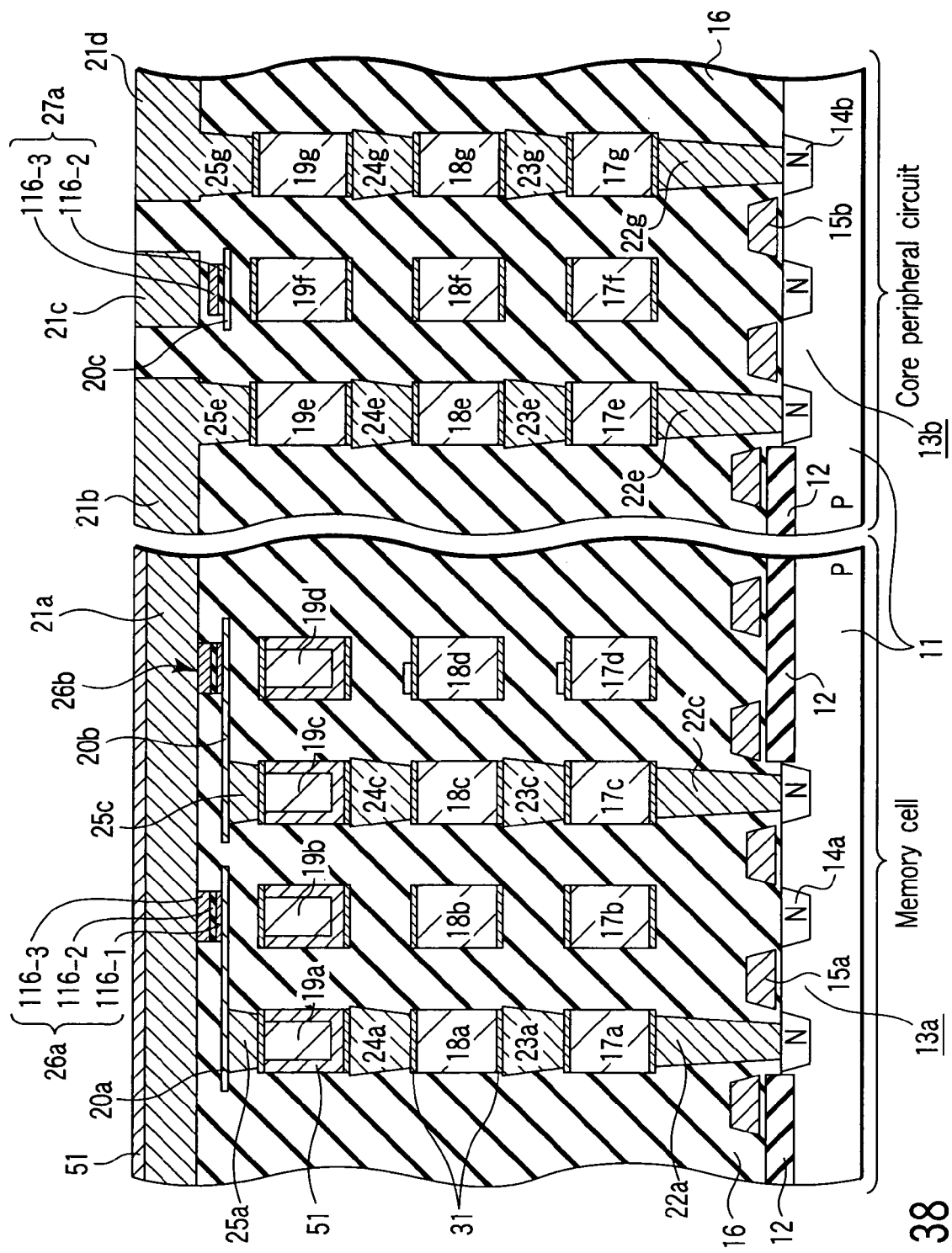
FIG. 38 is a sectional view of a major part showing a configuration of a magnetic memory device (MRAM) according to a fifth embodiment of the present invention.
Figure 39:
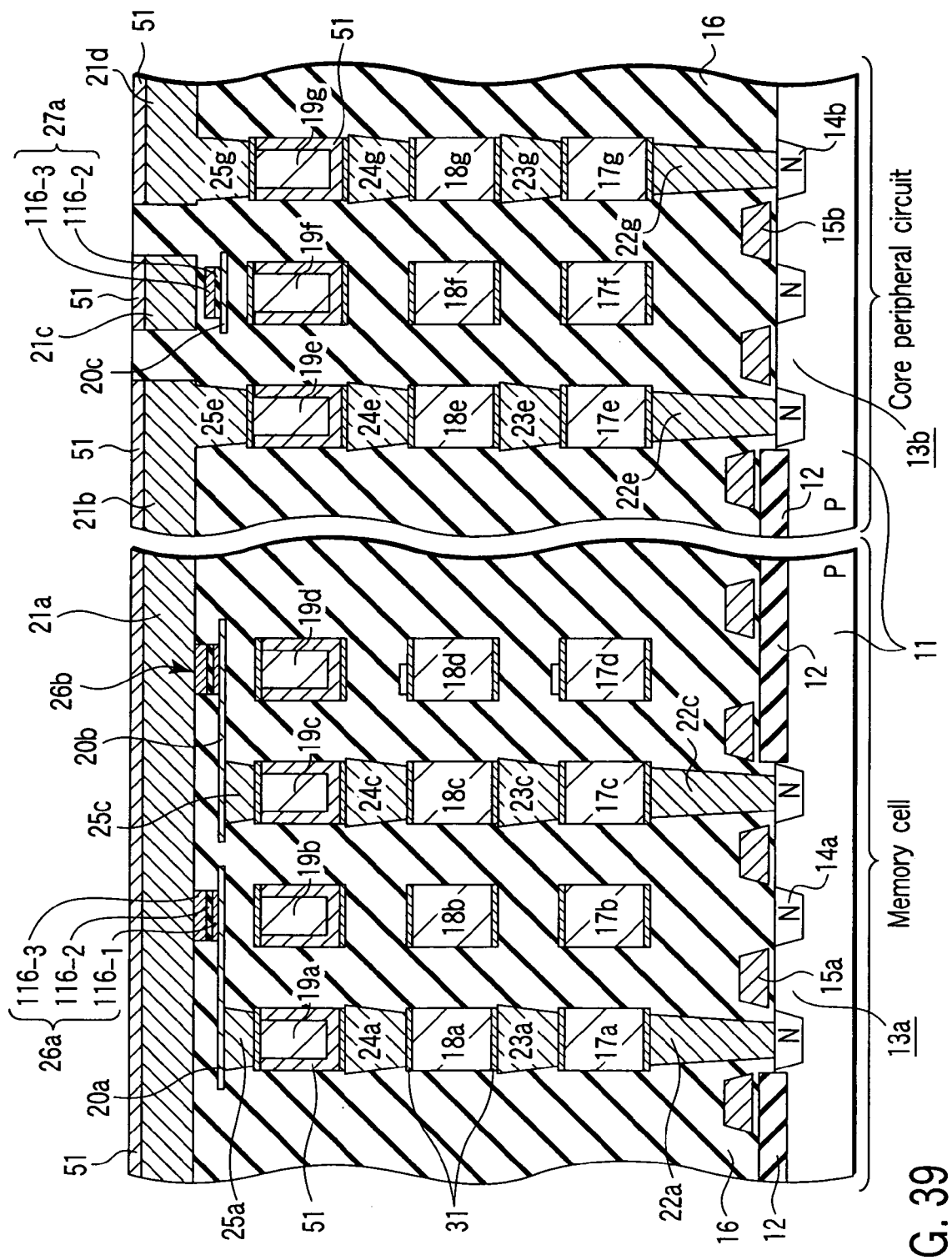
FIG. 39 is a sectional view of a major part showing another configuration of the magnetic memory device (MRAM) according to the fifth embodiment.

FIGS. 38 and 39 show examples of the configuration of an MRAM according to a fifth embodiment of the present invention. Explanation will be given, taking an MRAM with yoke-structure wiring lines as an example. In FIGS. 38 and 39, the sama parts as those in FIG. 11 are indicated by the same reference numerals and a detailed explanation of them will be omitted. In an MRAM using a yoke wiring structure, use of the MTJ film 27a of the second embodiment as shown in FIG. 38 or FIG. 39 instead of the MTJ film 27 makes it possible to avoid the effect of inductance between the wiring line 19f in the third level and the wiring line 21c in the fifth level in the core peripheral circuit.

[Sixth Embodiment]

Figure 41:
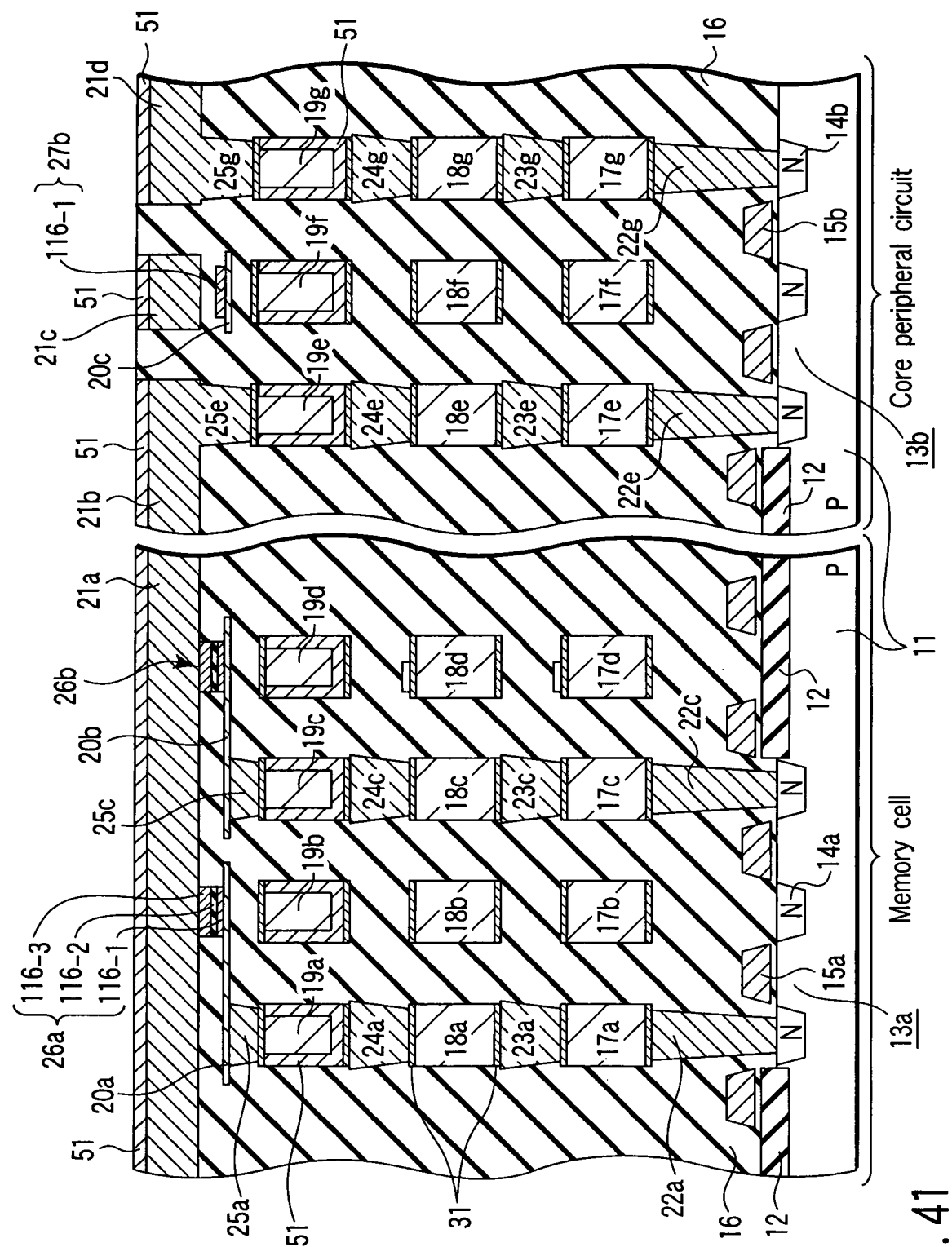
FIG. 41 is a sectional view of a major part showing another configuration of the magnetic memory device (MRAM) according to the sixth embodiment.

FIGS. 40 and 41 show examples of the configuration of an MRAM according to a sixth embodiment of the present invention. Explanation will be given, taking an MRAM with yoke structure wiring lines as an example. In FIGS. 40 and 41, the same parts as those in FIG. 24 are indicated by the same reference numerals and a detailed explanation of them will be omitted. In an MRAM using a yoke wiring structure, use of the MTJ film 27b of the third embodiment as shown in FIG. 40 or FIG. 41 instead of the MTJ film 27 or 27a makes it possible to avoid the effect of inductance between the wiring line 19f in the third level and the wiring line 21c in the fifth level in the core peripheral circuit.

[Seventh Embodiment]

MRAMs (magnetic memory devices) according to the first to sixth embodiments can be applied to various apparatuses. Some of the applications will be explained as a seventh embodiment of the present invention.

(Application 1)

Figure 42:
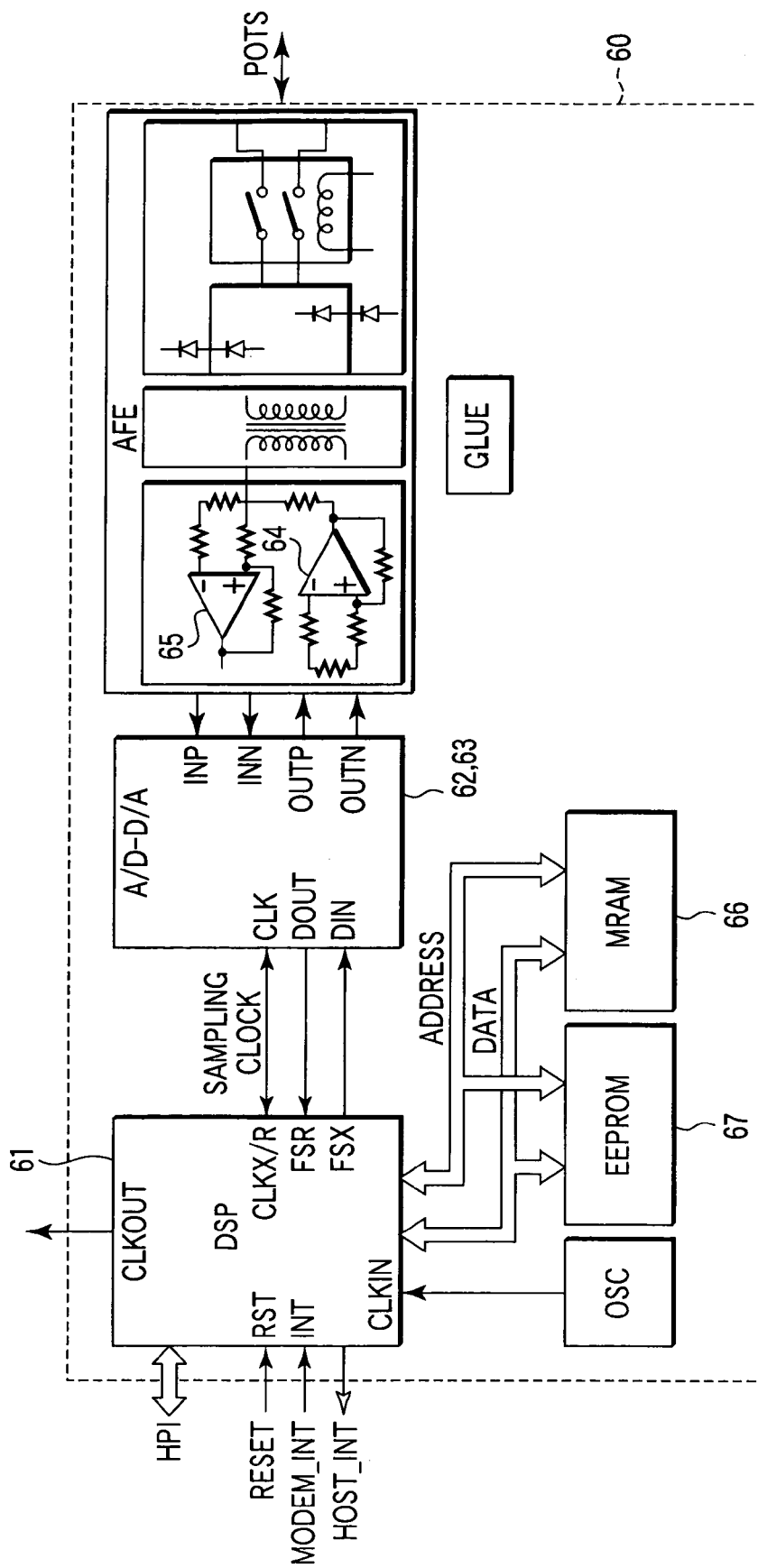
FIG. 42 is a block diagram showing the DSL data path part in a digital subscriber's line modem to which a magnetic memory device (MRAM) according to a seventh embodiment of the present invention is applied.

Application 1 is related to a case where an MRAM according to each of the embodiments of the present invention is used in a digital subscriber's line (DSL) data path part of the DSL modem as shown in FIG. 42. The modem 60 comprises a programmable digital signal processor (DSP) 61, an analog-digital (A/D) converter 62, a digital-analog (D/A) converter 63, a band-pass filter (not shown), a transmission driver 64, and a receiver amplifier 65. In application 1, there are provided an MRAM 66 and an EEPROM (Electrically Erasable and Programmable Read Only Memory) 67 as memories for various types of options to store line code programs instead of the band-pass filter.

The line code programs are programs for selecting and operating a modem according to the encoded subscriber's line information and transmission conditions (line codes, including QAM, CAP, RSK, FM, AM, PAM, and DWMT) executed on the DSP 61. While in application 1, two types of memories, the MRAM 66 and EEPROM 67, are used as the memories for storing the line code programs, the EEPROM 67 may be replaced with an MRAM. That is, the memories may be configured using only MRAMs instead of using two types of memories.

(Application 2)

Application 2 is related to a case where an MRAM is used to control a cellular phone terminal 70 as shown in FIG. 43. The cellular phone terminal 70 comprises a communication section 71 having a communication function and a control section 72 for controlling each section in the cellular phone terminal 70. The communication section 71 includes, for example, a transmitting/receiving antenna 71a, an antenna multiplexer 71b, a receiving section 71c, a baseband processing section 71d, a DSP 71e used as an audio codec, a speaker (receiver) 71f, a microphone (transmitter) 71g, a transmitting section 71h, and a frequency synthesizer 71i.

On the other hand, the control section 72 is a microcomputer formed by connecting a CPU 72a, a ROM 72b, an MRAM 72c, and a flash memory 72d to one another via a CPU bus 72e. In the ROM 72b, the data necessary to control the cellular phone terminal 70, including programs executed on the CPU 72a and display fonts, have been stored. The MRAM 72c is used mainly as a work space. The CPU 72a causes the MRAM 72c to store the data in the middle of calculations during the execution of a program as needed or to temporarily store the data exchanged between the control section 72 and each section. The flash memory 72d stores, for example, the setting condition immediately before the turning off of the power of the cellular phone terminal 70 in the form of setting parameters. This prevents the stored setting parameters from being lost even when the power of the cellular phone terminal 70 is turned off suddenly in a case where the cellular phone terminal 70 is used in such a manner that its settings are recovered to the original ones when the power is turned on next time.

The cellular phone terminal 70 further includes an audio reproducing section 73, an external output terminal 74, an LCD (liquid-crystal display) controller 75, a display LCD 76, and a ringer 77 for producing ringback tone. The audio reproducing section 73 reproduces audio information inputted to the cellular phone terminal 70 (or audio information stored in an external memory 81 explained later). The reproduced audio information is sent to a headphone or a portable speaker via an external output terminal 74, thereby being taken out to the outside world. Use of the audio reproducing section 73 enables audio information to be reproduced. When receiving display information from, for example, the CPU 72a via the CPU bus 72e, the LCD controller 75 creates LCD control information for controlling the LCD 76 from the display information. Then, according to the LCD control information, the LCD controller 75 causes the LCD 76 to make a display.

The cellular phone terminal 70 further includes interface circuits (I/F) 78a, 78b, 78c, an external memory 81, an external memory slot 82, a key operation section 83, and an external input/output terminal 84. In the external memory slot 82, an external memory 81, such as a memory card, is inserted. The external memory slot 82 is connected to the CPU bus 72e via the interface circuit 78a. As described above, providing the external memory slot 82 in the cellular phone terminal 70 makes it possible to write the information in the cellular phone terminal 70 into the external memory 81 or input the information (for example, audio information) stored in the external memory 81 to the cellular phone terminal 70.

The key operation section 83 is connected to the CPU bus 72e via the interface circuit 78b. The key input information inputted from the key operation section 83 is transferred to, for example, the CPU 72a. The external input/output terminal 84 is connected to the CPU bus 72e via the interface circuit 78c. The external input/output terminal 84 functions as a terminal when various pieces of information are externally inputted to the cellular phone terminal 70 or the cellular phone terminal outputs information to the outside world.

While in application 2, the ROM 72b, MRAM 72c, and flash memory 72d are used, the flash memory 72d may be replaced with an MRAM. In addition, the ROM 72b may be replaced with an MRAM.

(Application 3)

Application 3 is related to a case where an MRAM (MRAM card) is used as a card that stores media content, such as a smart media, as shown in FIGS. 44 to 48.

Figure 44:
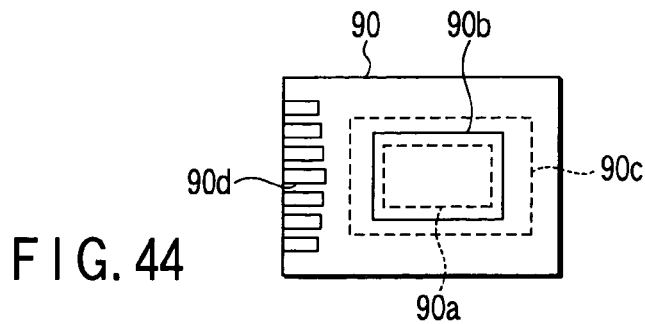
FIG. 44 is a block diagram showing a configuration of an MRAM card to which a magnetic memory device (MRAM) of the seventh embodiment is applied.

As shown in FIG. 44, an MRAM chip 90a is housed in an MRAM card body 90. In the MRAM card body 90, an opening 90b is made in a position corresponding to the MRAM chip 90a. On the opening 90b, a shutter 90c is provided. The MRAM chip 90a exposed in the opening 90b is protected by the shutter 90c when the MRAM card is carried with the user. The shutter 90c is made of a material having the property of shielding the MRAM from an external magnetic field, such as ceramics. To transfer content data to the MRAM card, the shutter 90c is opened to expose the MRAM chip 90a. An external terminal 90d is used to take out the content data transferred to the MRAM card into the outside world.

Figure 45:
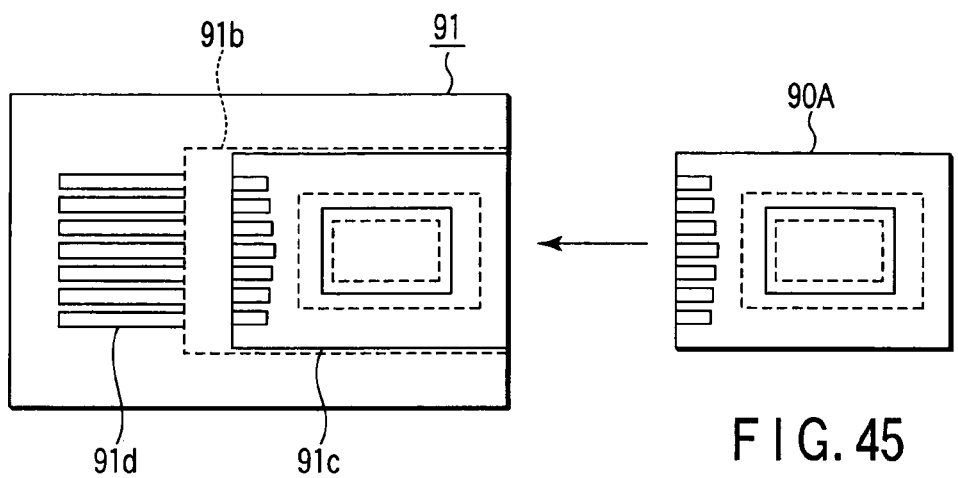
FIG. 45 is a top view showing a configuration of a card insertion transfer unit for transferring data to the MRAM card of FIG. 44.
Figure 46:
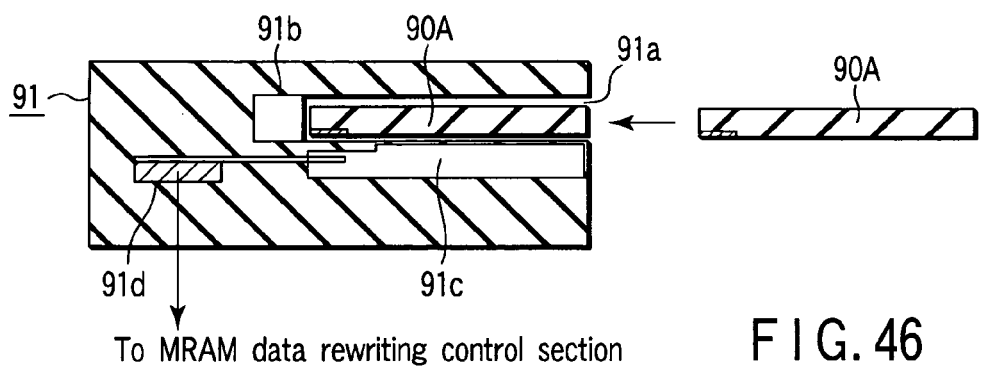
FIG. 46 is a sectional view of the card insertion transfer unit of FIG. 45.

FIGS. 45 and 46 show an example of the configuration of a card insertion transfer unit for transferring data to the MRAM card. FIG. 45 is a top view of the transfer unit. FIG. 46 is a sectional view of the transfer unit.

An MRAM card 90A the end user uses is inserted into the insert section 91a of the transfer unit 91 in the direction shown by the arrow in FIG. 45. The MRAM card 90A is pushed until it is stopped by a stopper 91b. The stopper 91b also acts as a member for aligning the MRAM 91c and the MRAM card 90A with each other. After the MRAM card 90A is housed in a predetermined position, an MRAM data rewriting control section (not shown) supplies a control signal to an external terminal 91d. Then, the content data stored in the MRAM 91c is transferred to the MRAM card 90A.

Figure 47:
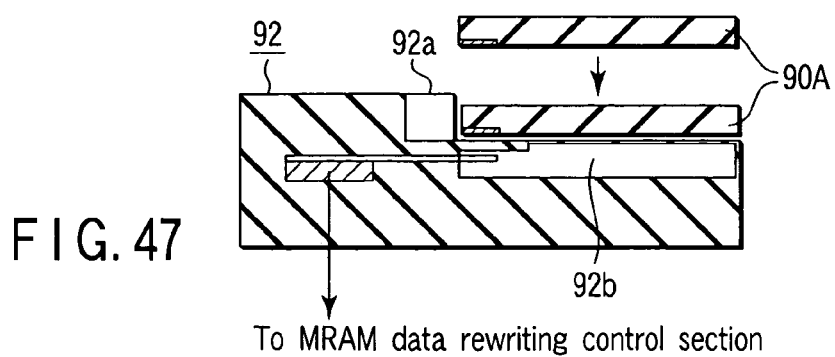
FIG. 47 is a sectional view showing a configuration of a card mount transfer unit for transferring data to the MRAM card of FIG. 44.

FIG. 47 shows an example of the configuration of a card mount transfer unit. The transfer unit 92 is such that the MRAM card 90A is mounted in the direction shown by the arrow in FIG. 47, aiming at a stopper 92a, and placed on the MRAM 92b. Since a method of transferring content data is the same as in the card insertion transfer unit 91, its explanation will be omitted.

Figure 48:
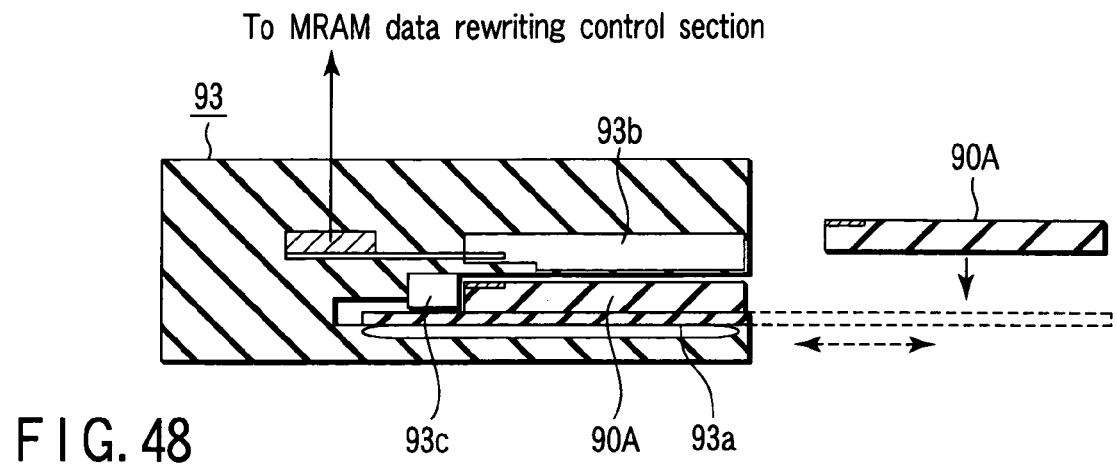
FIG. 48 is a sectional view showing a configuration of a slide transfer unit for transferring data to the MRAM card of FIG. 44.
Figure 50:
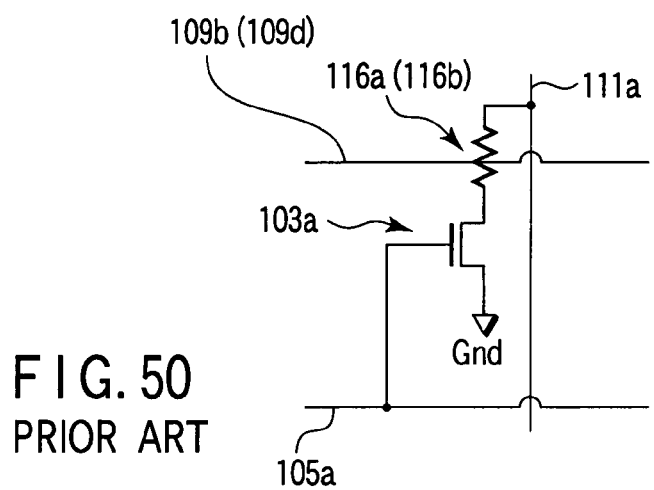
FIG. 50 shows an equivalent circuit of an MRAM cell, taking a conventional magnetic memory device as an example.

FIG. 48 shows an example of the configuration of a slide transfer unit. The transfer unit 93 is provided with a saucer slide 93a. The saucer slide 93a moves in the direction shown by the arrow in FIG. 48 as does a CD-ROM drive or a DVD drive. When the saucer slide 93a has moved to the position shown by a broken line, the MRAM card 90A is placed on the saucer slide 93a. Then, the MRAM card 90A is conveyed automatically to the inside of the transfer unit 93 provided with an MRAM 93b and is stopped at the position where the leading edge of the MRAM card 90A presses against the stopper 93c. Since a method of transferring content data is the same as in the card insertion transfer unit 91, its explanation will be omitted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic memory device comprising:
   a memory cell which includes a first wiring line composed of a first wiring layer, a second wiring line composed of a second wiring layer and provided above or below the first wiring line so as to cross the first wiring line, and a magnetoresistive effect element device provided in a position where the first wiring line and the second wiring line cross each other; and
   a peripheral circuit which includes a third wiring line provided around the memory cell and composed of the first wiring layer, a fourth wiring line provided above or below the third wiring line and composed of the second wiring layer, and a magnetic layer provided between the third wiring line and the fourth wiring line and separated from both of the third wiring line and the fourth wiring line, and the magnetic layer electrically connected to only one of the third wiring line and the fourth wiring line via a nonmagnetic layer.

2. The magnetic memory device according to claim 1, wherein the magnetic layer is provided so as to correspond to at least a part of the third wiring line and the fourth wiring line.

3. The magnetic memory device according to claim 1, wherein the magnetoresistive effect element device has a three-layered structure including two magnetic layers and a nonmagnetic layer provided between the two magnetic layers.

4. The magnetic memory device according to claim 1, wherein the first and second wiring lines have each a yoke structure.

5. The magnetic memory device according to claim 1, wherein at least one of the first to fourth wiring lines has a yoke structure.

6. The magnetic memory device according to claim 1, wherein the memory cell further includes a switching element device electrically connected to the magnetoresistive effect element device.

7. The magnetic memory device according to claim 1, wherein the magnetic layer is composed of a magnetic layer used to form the magnetoresistive effect element device in the memory cell.

8. The magnetic memory device according to claim 1, wherein an insulator film is provided between the other of the third wiring line and the fourth wiring line and the magnetic layer, and the insulator film is an interlayer insulator film.

9. The magnetic memory device according to claim 1, wherein the magnetic layer is a single layer.

10. The magnetic memory device according to claim 1, wherein the nonmagnetic layer is composed of a nonmagnetic layer used to form the magnetoresistive effect element device of the memory cell.

* * * * *